(12) United States Patent
Arakawa

(10) Patent No.: US 9,006,852 B2
(45) Date of Patent: Apr. 14, 2015

(54) SOLID-STATE IMAGING DEVICE WITH A LIGHT SHIELDING LAYER FORMED AROUND A TRANSFER GATE

(71) Applicant: Sony Corporation, Tokyo (JP)

(72) Inventor: Shinichi Arakawa, Kumamoto (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 13/661,876

(22) Filed: Oct. 26, 2012

(65) Prior Publication Data

US 2013/0127003 A1 May 23, 2013

(30) Foreign Application Priority Data

Nov. 22, 2011 (JP) .................................. 2011-254645

(51) Int. Cl.
*H01L 27/146* (2006.01)
(52) U.S. Cl.
CPC .... *H01L 27/14612* (2013.01); *H01L 27/14623* (2013.01); *H01L 27/14645* (2013.01); *H01L 27/14689* (2013.01); *H01L 27/14627* (2013.01)
(58) Field of Classification Search
CPC ............... H01L 27/14612; H01L 27/14689; H01L 27/14623; H01L 27/14645; H01L 27/14627

USPC ............... 257/435, E31.001, E27.13; 438/73
See application file for complete search history.

(56) References Cited

U.S. PATENT DOCUMENTS

| | | | |
|---|---|---|---|
| 2006/0125007 A1* | 6/2006 | Rhodes | 257/346 |
| 2007/0040194 A1* | 2/2007 | Misawa | 257/291 |
| 2008/0105908 A1* | 5/2008 | Lee | 257/290 |
| 2009/0305499 A1* | 12/2009 | Gambino et al. | 438/637 |
| 2010/0176272 A1* | 7/2010 | Itahashi | 250/208.1 |

FOREIGN PATENT DOCUMENTS

| | | |
|---|---|---|
| JP | 2010-165753 | 7/2010 |
| JP | 2010-177418 | 8/2010 |
| JP | 2011-029835 | 2/2011 |

* cited by examiner

*Primary Examiner* — Fernando L. Toledo
*Assistant Examiner* — Peter Bradford
(74) *Attorney, Agent, or Firm* — Rader, Fishman & Grauer PLLC

(57) ABSTRACT

Disclosed herein is a solid-state imaging element including: a transfer section configured to transfer charge generated simultaneously by a photoelectric conversion section in all pixels to a memory section and have a metal gate; and a light-shielding section formed by filling a metal into a groove portion formed by digging an interlayer insulating film around the transfer section.

13 Claims, 18 Drawing Sheets

FIG. 16
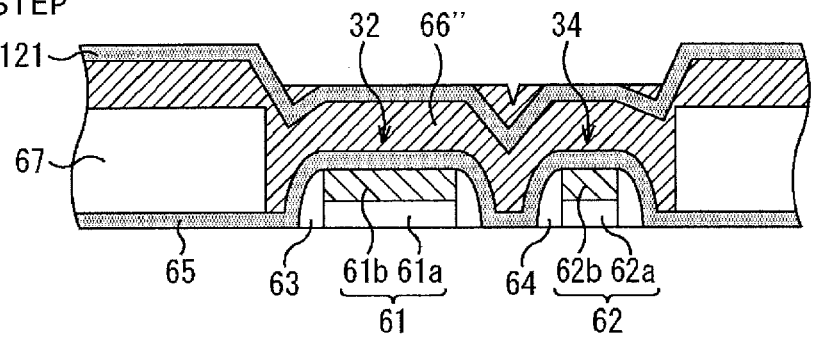
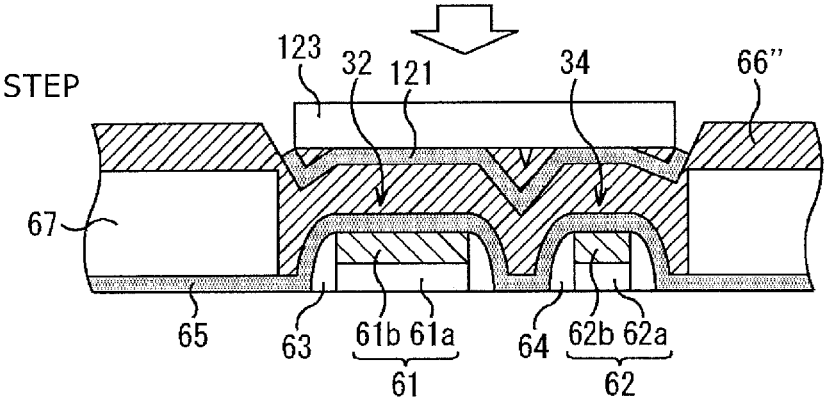
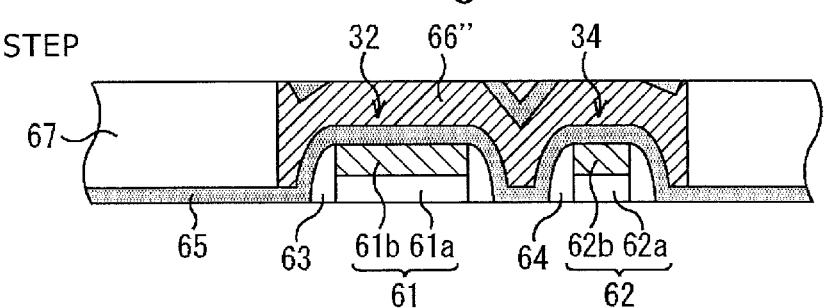
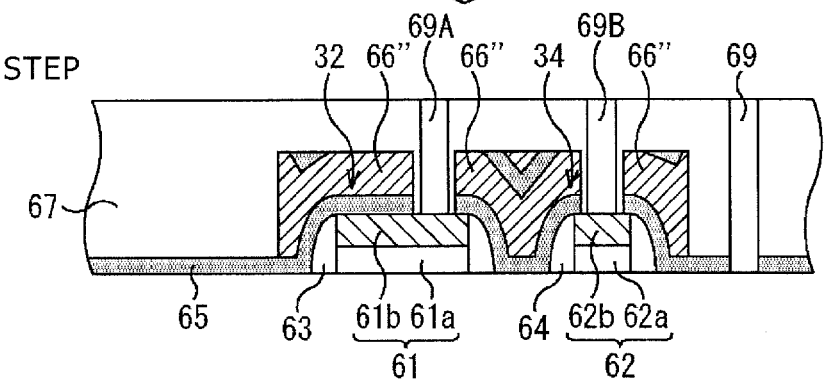

SOLID-STATE IMAGING DEVICE WITH A LIGHT SHIELDING LAYER FORMED AROUND A TRANSFER GATE

BACKGROUND

The present disclosure relates to a solid-state imaging element and manufacturing method of the same and electronic equipment, and more particularly, to a solid-state imaging element and manufacturing method of the same that provide compatibility between excellent sensitivity and smear characteristics, and to electronic equipment having the same.

Solid-state imaging elements such as CMOS (Complementary Metal Oxide Semiconductor) image sensors and CCDs (Charge Coupled Devices) have found wide application to digital still cameras and digital video camcorders. Further, recent years have witnessed frequent use of a MOS image sensor in the solid-state imaging element incorporated in mobile phones and mobile devices having imaging capability for its low source voltage and low power consumption.

For example, incident light falling on a CMOS image sensor is converted into charge by a PD (Photodiode), i.e., a photoelectric conversion section of each pixel. Then, the charge generated by the PD is transferred to an FD (Floating Diffusion), i.e., a floating diffusion region, so that an amplifying transistor outputs a pixel signal whose level is proportional to the charge accumulated in the FD.

Incidentally, a CMOS image sensor performs rolling shutter image capture in which charge is transferred from the PD to FD on a pixel row by pixel row basis, thus resulting in image distortion. In order to avoid such distortion, it is necessary to perform global shutter image capture in which charge is transferred from the PD to FD in all pixels at the same time.

For example, Japanese Patent Laid-Open No. 2011-29835 proposes a CMOS solid-state imaging device that permits simultaneous storage of an image for global shutter image capture by providing a storage element (capacitor) in each pixel.

In a CMOS solid-state imaging device configured to permit global shutter image capture by providing a storage element in each pixel, a smear may occur due to light leaking into the storage element while charge is held therein, thus resulting in degraded image quality attributable to light leaking thereinto. A possible countermeasure against such leakage of light into the storage element would be to use a light-shielding film adapted to shield light from the storage element.

It is, for example, possible to use an interconnect layer as a light-shielding film. However, it is preferred that a light-shielding film should be provided immediately on top of the storage element to ensure higher effectiveness. However, providing a metal light-shielding film immediately on top of the storage element leads to a thicker interlayer insulating film under the interconnect layer, thus resulting in deteriorated sensitivity. Further, in this case, it may be more difficult to form contacts, thus resulting in deteriorated yield. In particular, the larger the pixel count, and the larger the area occupied by peripheral circuitry, the greater the impact of the thicker interlayer insulating film under the interconnect layer tends to be.

In response thereto, Japanese Patent Laid-Open No. 2010-165753 (hereafter referred to as Patent Document 2) discloses a structure adapted to reduce the height of the interlayer structure by using a light-shielding metallic material as a gate electrode on top of the memory. However, it is difficult for the structure disclosed in Patent Document 2 to sufficiently suppress light leakage from the side of the gate.

Further, Japanese Patent Laid-Open No. 2010-177418 (hereafter referred to as Patent Document 3) discloses a structure designed to reduce the height by using a light-shielding film having a damascene structure. However, if the layout has a significantly high coverage ratio of the light-shielding electrode, the structure disclosed in Patent Document 3 leads to dishing in the metal film during the CMP (Chemical Mechanical Polishing) process adapted to form a damascene structure, significantly adversely affecting the pixel characteristics and later process steps. Among possible concerns are deterioration of light-shielding capability due to varying thickness of the light-shielding film, failure to open contacts in later process steps due to aggravation of the local and global flatness, generation of residue during patterning, and failure to open contacts due to defocusing during lithography.

As described above, it is significantly unfeasible that a countermeasure process will be achieved using the structures disclosed in Patent Documents 2 and 3.

SUMMARY

As described above, it is significantly unfeasible that a countermeasure process will be achieved using the structures disclosed in Patent Documents 2 and 3. Therefore, it has been difficult to reduce the height of the interlayer film and suppress leakage of light into the storage element in a CMOS solid-state imaging device configured to permit global shutter image capture. As a result, it has been difficult to provide compatibility between excellent sensitivity and smear characteristics in the solid-state imaging elements in related art.

In light of the foregoing, it is desirable to provide compatibility between excellent sensitivity and smear characteristics.

A solid-state imaging element according to a mode of the present disclosure includes a transfer section and light-shielding section. The transfer section transfers charge generated simultaneously by a photoelectric conversion section in all pixels to a memory section and has a metal gate. The light-shielding section is formed by filling a metal into a groove portion formed by digging an interlayer insulating film around the transfer section.

A manufacturing method according to the mode of the present disclosure includes a step of forming a metal gate of a transfer section configured to transfer charge generated simultaneously by a photoelectric conversion section in all pixels to a memory section. The manufacturing method further includes a step of forming a groove portion by digging an interlayer insulating film around the transfer section. The manufacturing method still further includes a step of filling a metal into the groove portion.

Electronic equipment according to the mode of the present disclosure has a solid-state imaging element. The solid-state imaging element includes a transfer section and light-shielding section. The transfer section transfers charge generated simultaneously by a photoelectric conversion section in all pixels to a memory section and has a metal gate. The light-shielding section is formed by filling a metal into a groove portion formed by digging an interlayer insulating film around the transfer section.

In the mode of the present disclosure, the transfer section configured to transfer charge generated simultaneously by the photoelectric conversion section in all pixels to the memory section has a metal gate. The light-shielding section is formed by filling a metal into the groove portion formed by digging the interlayer insulating film around the transfer section.

The mode of the present disclosure provides compatibility between excellent sensitivity and smear characteristics.

BRIEF DESCRIPTION OF THE DRAWINGS

FIG. 16 is a set of explanatory diagrams describing the manufacturing method of the imaging element;

DETAILED DESCRIPTION OF THE PREFERRED EMBODIMENT

A detailed description will be given below of a specific embodiment to which the present technology is applied with reference to the accompanying drawings.

Figure 1:
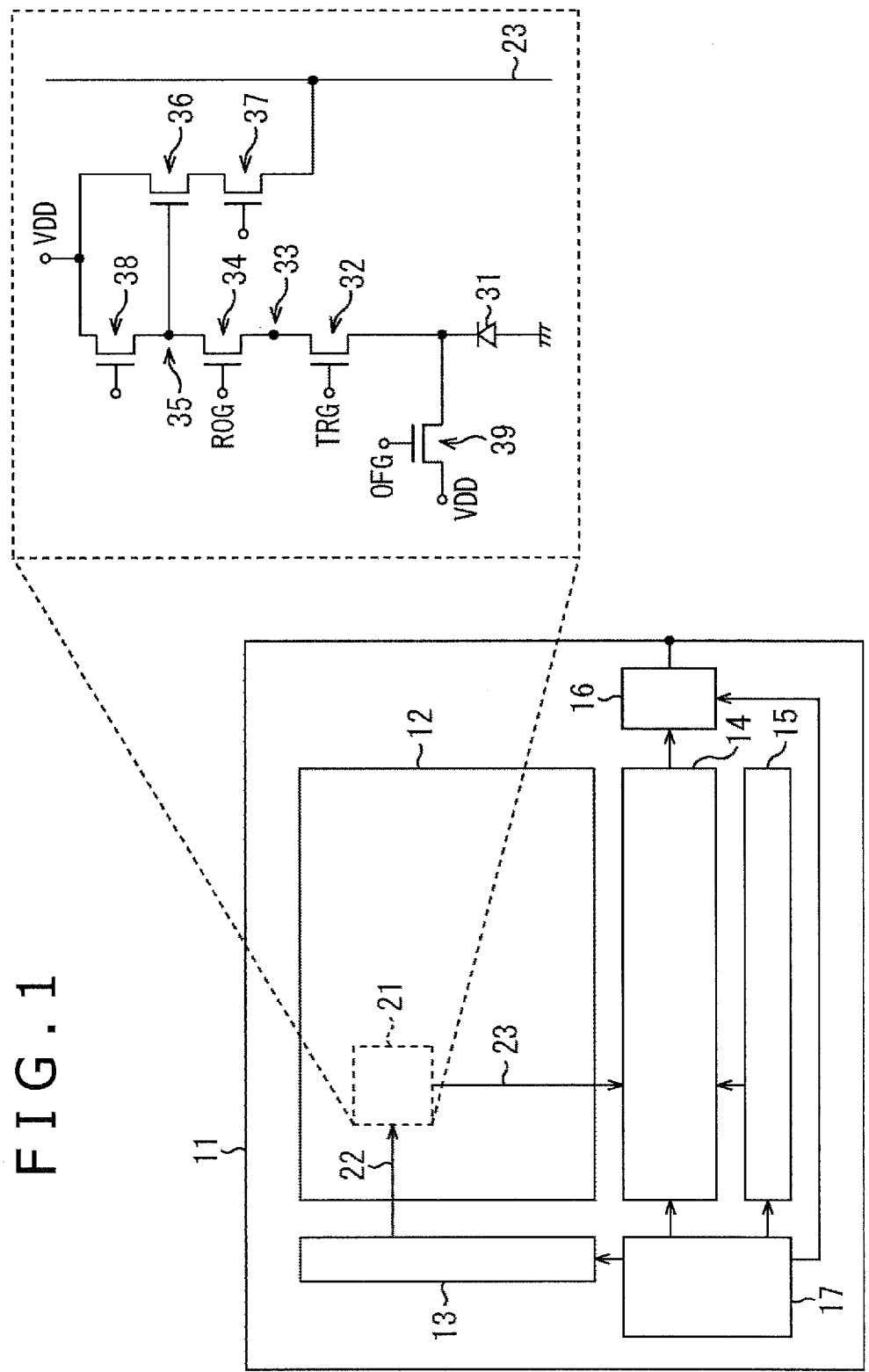
FIG. 1 is a block diagram illustrating a configuration example of an embodiment of an imaging element to which the present disclosure is applied.

FIG. 1 is a block diagram illustrating a configuration example of an embodiment of an imaging element to which the present technology is applied.

An imaging element 11 is a CMOS solid-state imaging element and includes a pixel array section 12 that has a plurality of pixels, each having a photoelectric conversion section, arranged regularly. The same element 11 also includes peripheral circuit sections, namely, a vertical drive section 13, column processing section 14, horizontal drive section 15, output section 16 and drive control section 17.

The pixel array section 12 has a plurality of pixels 21 arranged in an array form. The same section 12 is connected to the vertical drive section 13 via a plurality of horizontal signal lines 22 whose number matches the number of rows of the pixels 21 and to the column processing section 14 via a plurality of vertical signal lines 23 whose number matches the number of columns of the pixels 21. That is, each of the plurality of pixels 21 of the pixel array section 12 is provided at an intersection between one of the horizontal signal lines 22 and one of the vertical signal lines 23.

The vertical drive section 13 successively supplies a drive signal (e.g., transfer signal, read signal, selection signal or reset signal), adapted to drive the pixels 21 of the pixel array section 12, to these pixels 21 on a row-by-row basis via the horizontal signal lines 22.

The column processing section 14 performs CDS (Correlated Double Sampling) on the pixel output from each of the pixels 21 via the vertical signal line 23, thus extracting the level of the pixel signal and acquiring pixel data proportional to the amount of light received by each of the pixels 21.

The horizontal drive section 15 successively supplies a drive signal to the column processing section 14 on a column-by-column basis of the pixels 21 of the pixel array section 12. The drive signal causes the column processing section 14 to output the pixel data acquired from the pixels 21.

The output section 16 is supplied with the pixel data from the column processing section 14 at a timing matching the drive signal from the horizontal drive section 15. The same section 16, for example, amplifies the pixel data and outputs the resultant data to an image processing circuit at the subsequent stage.

The drive control section 17 controls the driving of each of the internal blocks of the imaging element 11. For example, the same section 17 generates clock signals, each in accordance with the intervals at which each of the blocks is driven, thus supplying these signals to the blocks.

Each of the pixels 21 includes a PD 31, transfer transistor 32, memory section 33, read transistor 34, FD 35, amplifying transistor 36, selection transistor 37, and first and second reset transistors 38 and 39.

The PD 31 is a photoelectric conversion section adapted to receive light irradiated onto the pixel 21, generate charge proportional to the amount of light received and accumulate the charge.

The transfer transistor 32 is driven in response to a drive signal supplied to its transfer gate electrode (TRG) from the vertical drive section 13, transferring the charge accumulated in the PD31 when turned ON. Here, the transfer of charge from the PD 31 to the memory section 33 takes place simultaneously in all the PDs 31 (at the same time) in the imaging element 11.

The memory section 33 temporarily stores the charge transferred from the PD 24 via the transfer transistor 32.

The read transistor 34 is driven in response to a read signal supplied to its read gate electrode (ROG) from the vertical drive section 13, reading the charge accumulated in the memory section 33 and directing it to the FD 35 when turned ON.

The FD 35 is a floating diffusion region that is formed at a connection point between the read transistor 34 and amplifying transistor 36 and has a given capacitance to store the charge read from the memory section 33 via the read transistor 34.

The amplifying transistor 36 is connected to a source potential VDD and outputs a pixel signal whose level is proportional to the amount of charge accumulated in the FD 35.

The selection transistor 37 is driven in response to a selection signal supplied from the vertical drive section 13, allowing the pixel signal output from the amplifying transistor 36 to be output to the vertical signal line 23 via the same transistor 37 when turned ON.

The first reset transistor 38 is driven in response to a reset signal supplied from the vertical drive section 13, discharging the charge accumulated in the FD 35 to the source potential VDD via the same transistor 38 when turned ON. This resets the FD to the source potential VDD.

The second reset transistor 39 serves as an overflow drain adapted to discharge charge from the PD 31 to the source potential VDD if the charge beyond a given level is generated by the PD 31.

It should be noted that the selection transistor 28 is used to make a selection in the pixel 21. However, the same transistor 28 may be omitted to form a circuit (so-called three-transistor configuration).

Figure 2:
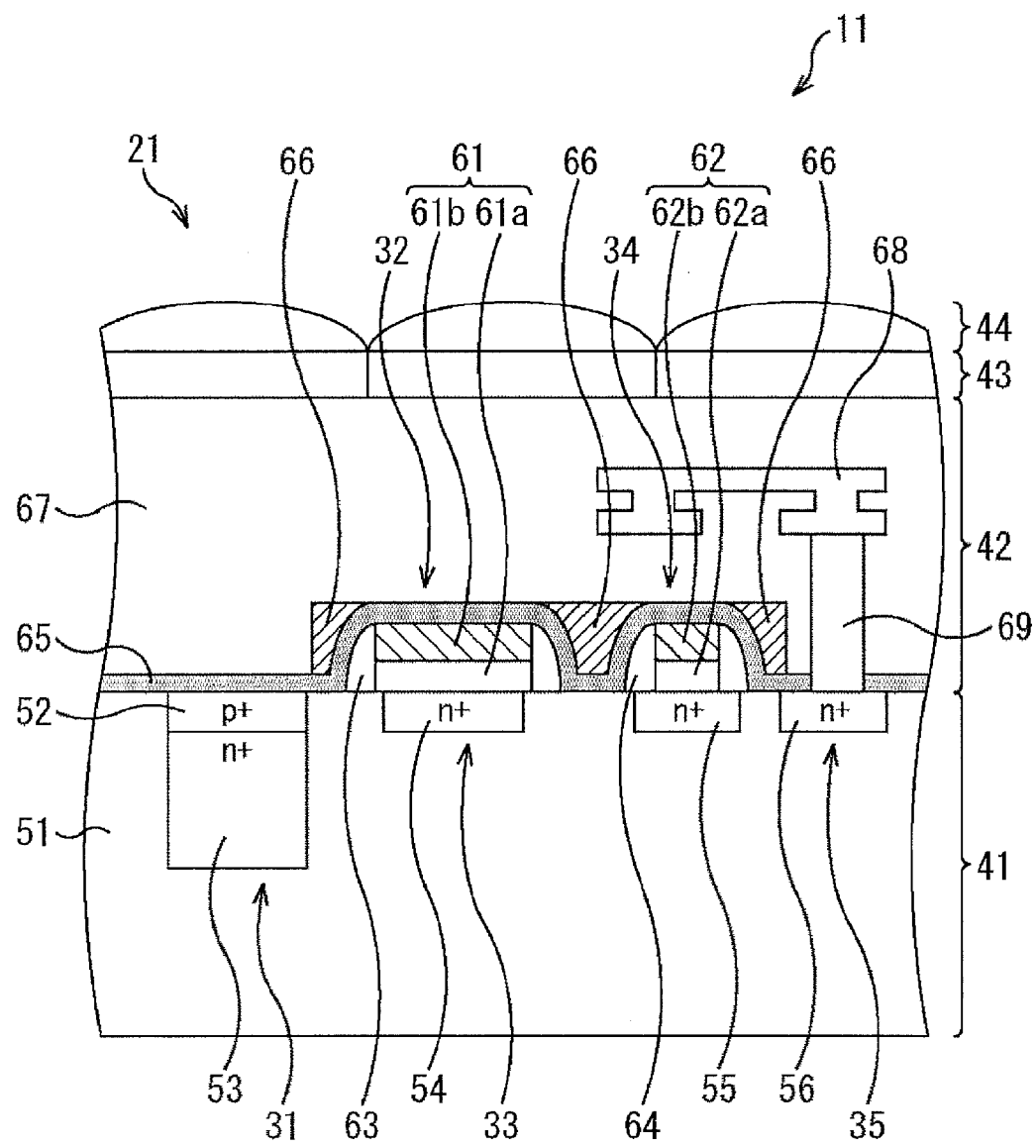
FIG. 2 is a cross-sectional view illustrating a first configuration example of a pixel of the imaging element.

FIG. 2 is a cross-sectional view illustrating a first configuration example of the pixel 21 of the imaging element 11.

As illustrated in FIG. 2, the imaging element 11 includes a semiconductor substrate 41, interconnect layer 42, color filter layer 43 and on-chip lens layer 44 that are stacked one on top of the other. The color filter layer 43 has filters, each adapted to pass red, blue or green light, for each of the pixels 21. The on-chip lens layer 44 has a plurality of small lenses for each of the pixels 21.

In the semiconductor substrate 41, for example, a p-type region 52 and n-type region 53 making up the PD 31, an n-type region 54 making up the memory section 33, an n-type region 55 making up the read transistor 34, and an n-type region 56 making up the FD 35, are formed in a p-type silicon layer (p well) 51.

In the interconnect layer 42, a gate electrode 61 making up the transfer transistor 32 and a gate electrode 62 making up the read transistor 34 are formed, with a gate insulating film (not shown) formed on the surface of the semiconductor substrate 41 sandwiched therebetween. The gate electrode 61 is arranged to overlap the position where the n-type region 54 is formed. The same electrode 61 has a laminated structure in which a metal layer 61b having light-shielding capability is stacked on top of a polysilicon layer 61a. The same layer 61a is formed above the semiconductor substrate 41 with the gate insulating film sandwiched therebetween. The gate electrode 62 is arranged to overlap the position where the n-type region 55 is formed. The same electrode 62 has a laminated structure in which a metal layer 62b having light-shielding capability is stacked on top of a polysilicon layer 62a. The same layer 62a is formed above the semiconductor substrate 41 with the gate insulating film sandwiched therebetween.

Further, in the interconnect layer 42, side walls 63 and 64 are formed respectively to surround the side surfaces of the gate electrodes 61 and 62, and a liner film 65 is formed in such a manner as to cover the semiconductor substrate 41, gate electrodes 61 and 62 and side walls 63 and 64. Still further, in the interconnect layer 42, a light-shielding metal 66 is formed in such a manner as to cover at least the memory section 33, after which an interlayer insulating film 67 is stacked on top of the light-shielding metal 66. Then, a contact section 69 is formed in such a manner as to connect an interconnect 68, formed in the interlayer insulating film 67, and the n-type region 56.

Here, the light-shielding metal 66 is formed by filling a metal into a groove portion formed by the damascene process which will be described later with reference to FIGS. 4 and 5. The damascene process is performed by digging the interlayer insulating film 67 formed to the same height as the liner film 65. At this time, groove portions are formed by the damascene process to surround the gate electrodes 61 and 62. Therefore, the light-shielding metal 66 is formed in such a manner as to surround the gate electrodes 61 and 62.

The pixel 21 is configured as described above, thus preventing leakage of light into the memory section 33 thanks to the metal layers 61b and 62b and light-shielding metal 66 and providing improved pixel characteristics.

A description will be given here of the difference in structure between the pixel 21 and the pixel in related art with reference to FIG. 3.

Figure 3:
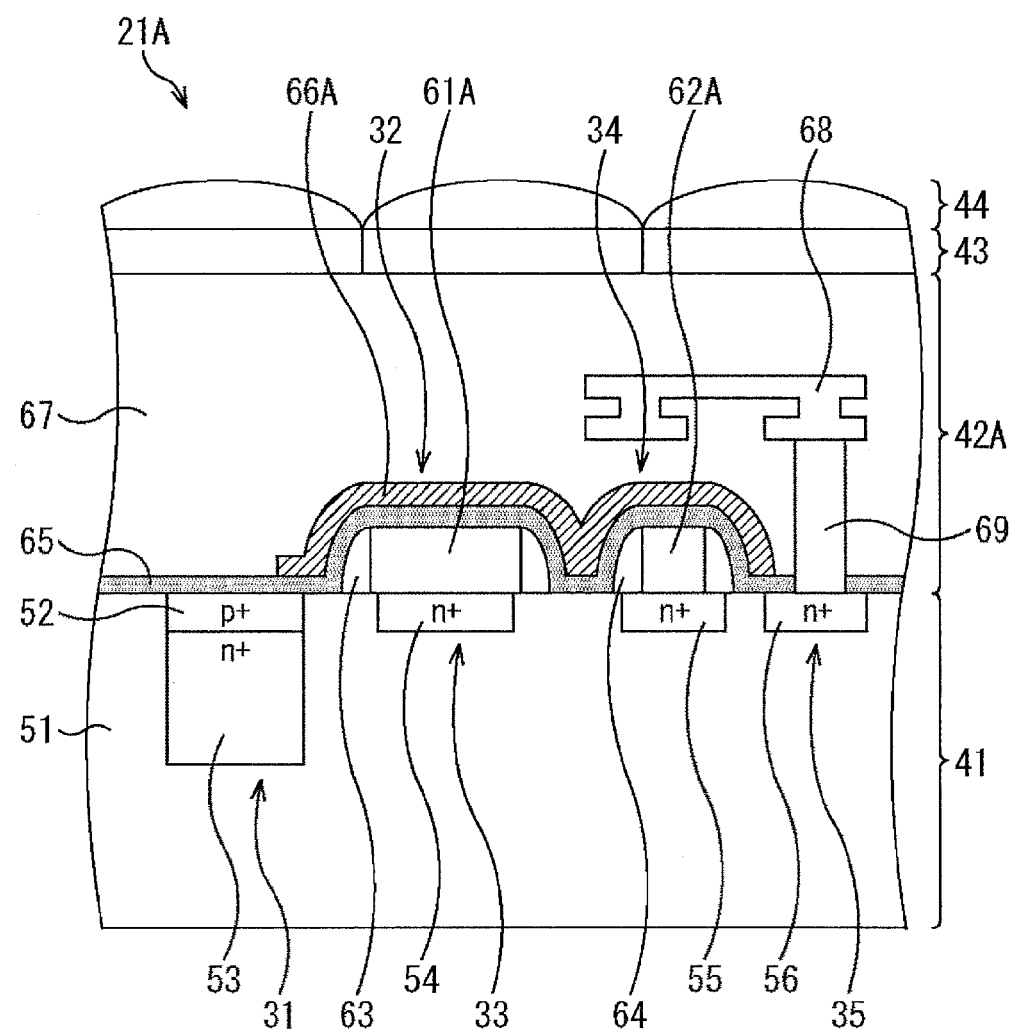
FIG. 3 is a cross-sectional view illustrating a configuration example of a pixel in related art.

FIG. 3 illustrates a cross-sectional configuration example of a pixel 21A in related art. It should be noted that, in FIG. 3, components similar to those of the pixel 21 shown in FIG. 2 are denoted by the same reference numerals, and that a detailed description thereof is omitted.

As illustrated in FIG. 3, in an interconnect layer 42A of a pixel 21A, gate electrodes 61A and 62A are formed with polysilicon, and a light-shielding metal 66A is formed in such a manner as to entirely cover the transfer transistor 32 and read transistor 34 with the liner film 65 sandwiched therebetween. Thus, in the pixel 21A, the light-shielding metal 66A is formed in such a manner as to be stacked above the gate electrodes 61A and 62A, unlike in the pixel 21 shown in FIG. 2. This leads to a greater thickness of the interconnect layer 42A as a whole with increase in the thickness of the light-shielding metal 66A. As described above, if the interconnect layer 42A is formed thick, diagonal light is likely to leak into the memory section 33, thus resulting in poorer sensitivity and smear characteristics. Moreover, the thick interconnect layer 42A gives rise to a number of open contacts and high resistance contacts, thus making it difficult to achieve sufficiently high pixel characteristics in the pixel 21A.

In contrast, in the pixel 21 shown in FIG. 2, the light-shielding metal 66 is formed in such a manner as to surround the gate electrodes 61 and 62, and not to be stacked above the same electrodes 61 and 62. This ensures that the interconnect layer 42 of the pixel 21 is shorter than the interconnect layer 42A of the pixel 21A. Therefore, leakage of light into the memory section 33 can be suppressed. As a result, the pixel 21 offers improved sensitivity and smear characteristics and excellent pixel characteristics. Moreover, the pixel 21 provides improved yield in terms of contact formation thanks to the shorter interconnect layer 42.

A description will be given next of the manufacturing method of the imaging element 11 having the pixel 21 with reference to FIGS. 4 and 5.

Figure 4:
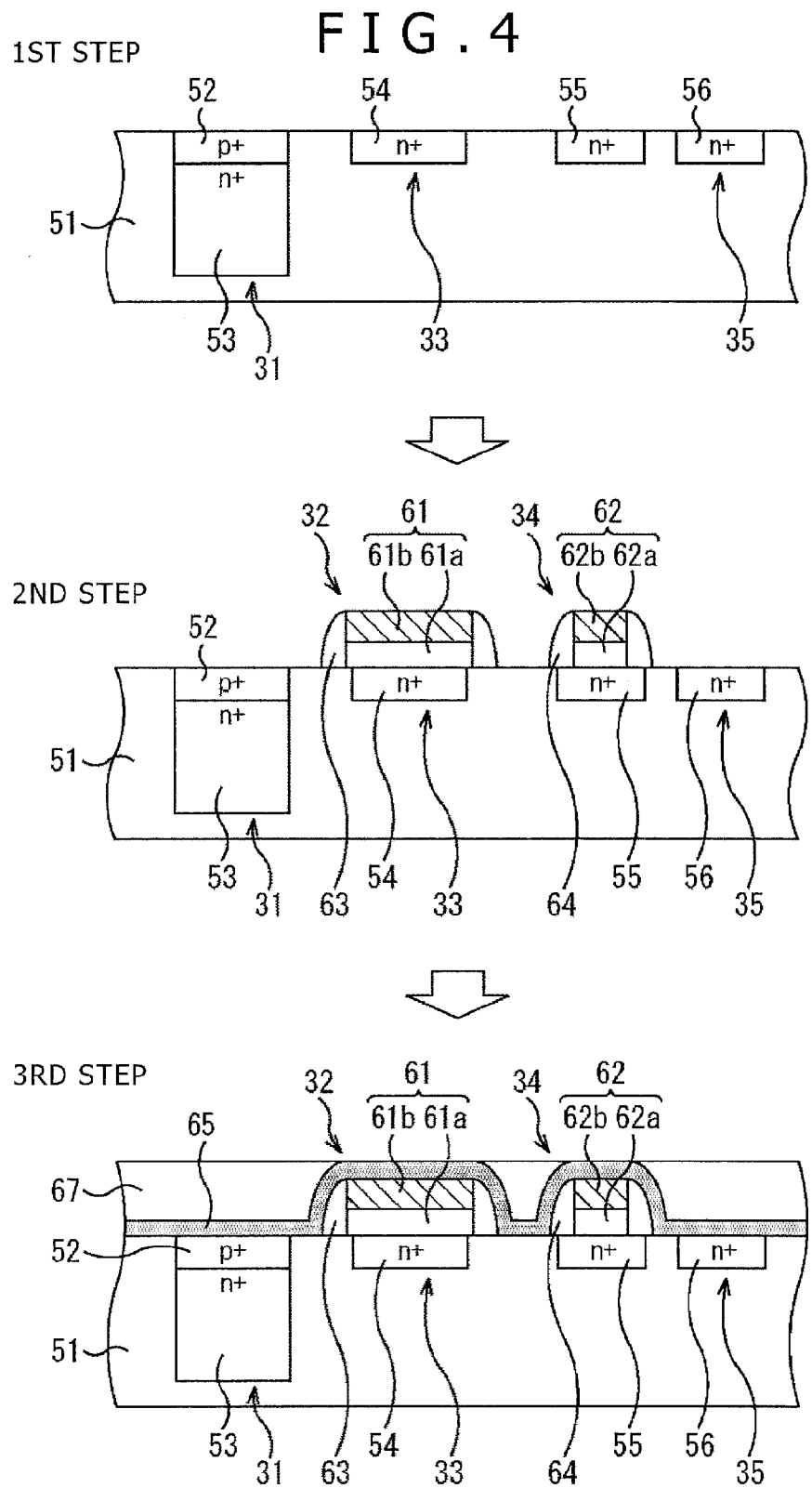
FIG. 4 is a set of explanatory diagrams describing the manufacturing method of the imaging element.

First, as illustrated in FIG. 4, the p-type region 52 and n-type regions 53 to 56 are formed in the first step. That is, the p-type region 52 and n-type regions 53 to 56 are formed at desired locations above the silicon layer 51, i.e., semiconductor substrate 41, by lithography and ion implantation.

In the second step, the gate electrodes 61 and 62 and side walls 63 and 64 are formed.

That is, after the formation of an unshown gate insulating film over the entire surface, polysilicon film and metal film are formed over the entire surface. The polysilicon film and metal film are each, for example, about 100 nm in thickness. On the other hand, a film made of a single metal such as tungsten, titanium, tantalum, aluminum, hafnium or copper can be used as a metal film. Alternatively, a film made of a nitride or oxide of any of the above metals or a combination thereof may also be used as a metal film.

Then, the polysilicon and metal in the undesired areas are removed by lithography and dry etching while at the same time leaving the polysilicon layers 61a and 62a and metal layers 61b and 62b unremoved. This forms a pattern that will form the gate electrodes 61 and 62. It should be noted that it is only necessary to use the metal layers 61*b* and 62*b* having light-shielding capability as the gate electrodes 61 and 62, and the same electrodes 61 and 62 are not limited to having a laminated structure made up of the polysilicon layers 61*a* and 62*a* and metal layers 61*b* and 62*b*.

On the other hand, among materials that can be used as the side walls 63 and 64 are single-layer insulating films made of an oxide or nitride or a combination thereof.

Next, the liner film 65 is formed over the entire surface, followed by the formation of the interlayer insulating film 67 in the third step.

The liner film 65 is formed by CVD (Chemical Vapor Deposition), and a nitride film of 50 nm in thickness is, for example, used. Further, after the formation of the liner film 65, the interlayer insulating film 67 is formed and planarized by CMP (Chemical Mechanical Polishing). A process using the liner film 65 as a stopper can be used to planarize the interlayer insulating film 67. This forms the interlayer insulating film 67 whose thickness is roughly the same as the height of the liner film 65 in the areas where the transfer transistor 32 and read transistor 34 are formed.

Figure 5:
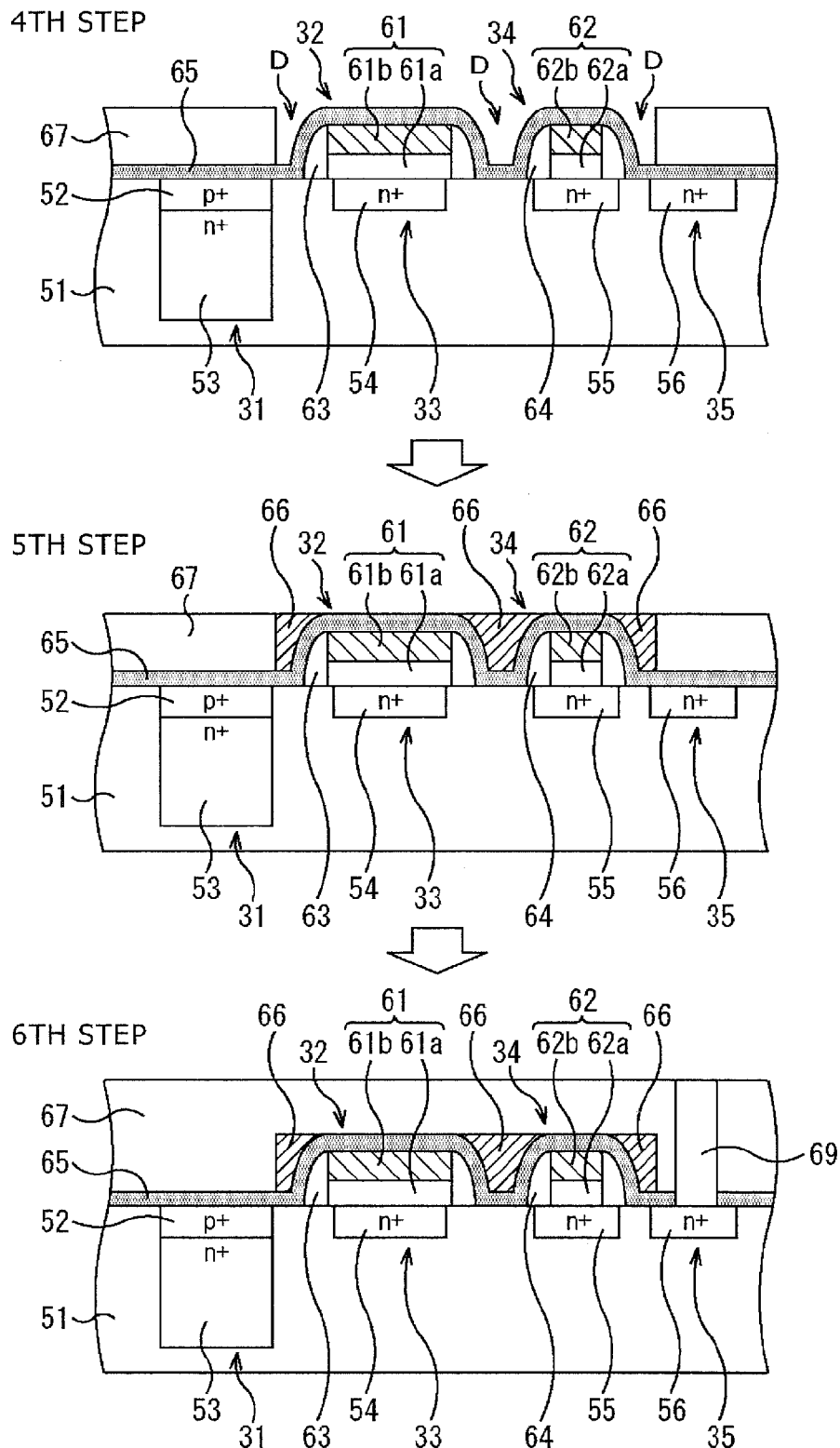
FIG. 5 is a set of explanatory diagrams describing the manufacturing method of the imaging element.

Next, a damascene portion is formed in the fourth step as illustrated in FIG. 5.

That is, the peripheral areas of the transfer transistor 32, memory section 33 and read transistor 34 are patterned by lithography. The width of the areas subjected to the damascene process is, for example, 100 nm from the outer peripheries of the transfer transistor 32 and read transistor 34. It should be noted that this width can be adjusted as appropriate according to the pixel design and desired smear characteristic. Then, groove portions D are formed by dry etching. At this time, the shape is stabilized by providing a selection ratio with respect to the liner film 65, which is accomplished, for example, by using a CFx-based gas.

The light-shielding metal 66 is formed in the fifth step.

That is, a metal is filled into the groove portions D formed by the damascene process in the fourth step, thus forming the light-shielding metal 66. The same metal 66 is formed, for example, by forming a blanket film using sputtered tungsten and then removing the metal in the undesired areas by CMP or dry etching.

It should be noted that the blanket film may be formed by CVD or sputtering or a combination thereof. On the other hand, not only a tungsten film but also a film made of a single metal such as titanium, tantalum, aluminum, hafnium or copper can be used as the light-shielding metal 66. Alternatively, a film made of a nitride, oxide or carbide of any of the above metals may also be used as the light-shielding metal 66. Still alternatively, a combination of the above may also be used as the light-shielding metal 66.

In the sixth step, the interlayer insulating film 67 is additionally stacked, thus forming the contact section 69.

Figure 6:
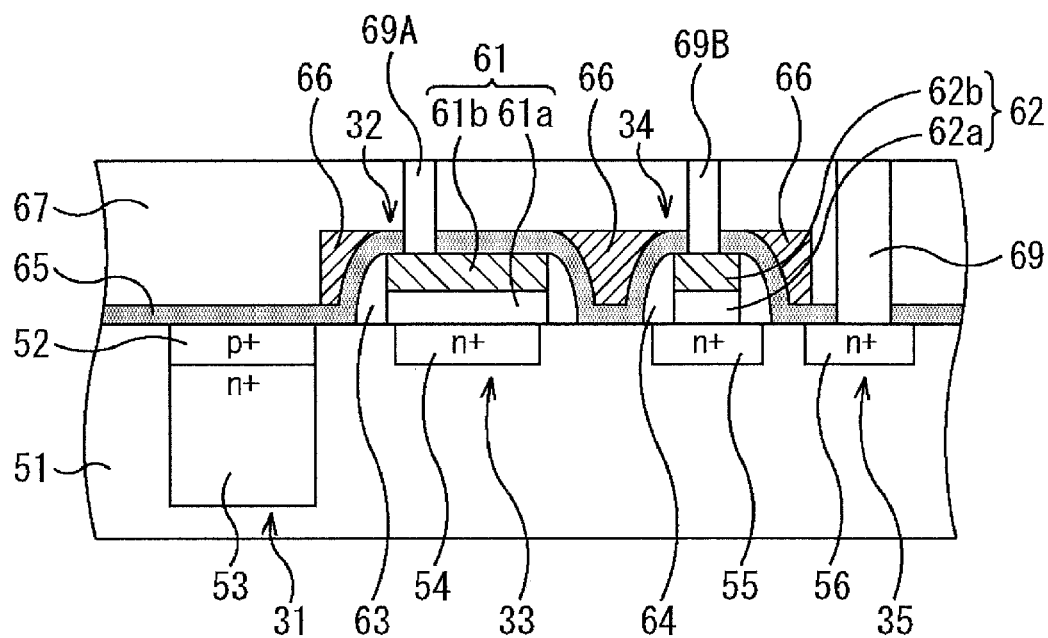
FIG. 6 is a cross-sectional view of the area where a contact section to be connected to a gate electrode is formed.

It should be noted that, in the sixth step, the contact section 69 is formed in such a manner as to supply a drive signal to the gate electrodes 61 and 62 concurrently with the formation of the contact section 69. FIG. 6 illustrates a cross-sectional configuration of the area where a contact section 69A to be connected to the gate electrode 61 and a contact section 69B to be connected to the gate electrode 62 are formed. On the other hand, it is easy to maintain the selection ratio with respect to the metal because the metal layers 61*b* and 62*b* having light-shielding capability are used respectively as the top portions of the gate electrodes 61 and 62 during the formation of the contact sections 69A and 69B, thus preventing the deterioration of the light-shielding capability. It should be noted that contact is established with the gate electrodes 61 and 62 by means of direct connection to the gates. Therefore, it is not necessary to consider establishing contact via the substrate. Contact is established with other transistors by using the same structure as for establishing contact between the contact section 69 and the FD 35.

Then, as illustrated in FIG. 2, the interconnect 68 is formed, followed by the additional stacking of the interlayer insulating film 67. Then, the color filter layer 43 and on-chip lens layer 44 are formed, thus completing the formation of the imaging element 11 having global shutter capability.

The imaging element 11 can be manufactured through the above steps, and it is possible to provide improved light-shielding capability of the memory section 33 and reduce the height of the interconnect layer 42 by filling the light-shielding metal 66 into the groove portions D formed by the damascene process. Further, it is possible to reduce the coverage ratio of the light-shielding metal 66, thus preventing dishing in the same metal 66 caused by CMP or other process. This makes it possible to avoid the degradation of the pixel characteristics, thus preventing adverse impact on the subsequent steps. That is, it is possible to avoid the concerns regarding the structure disclosed in Patent Document 3.

A description will be given next of the modification examples of the first configuration example of the pixel 21 with reference to FIGS. 7 and 8.

Figure 7A:
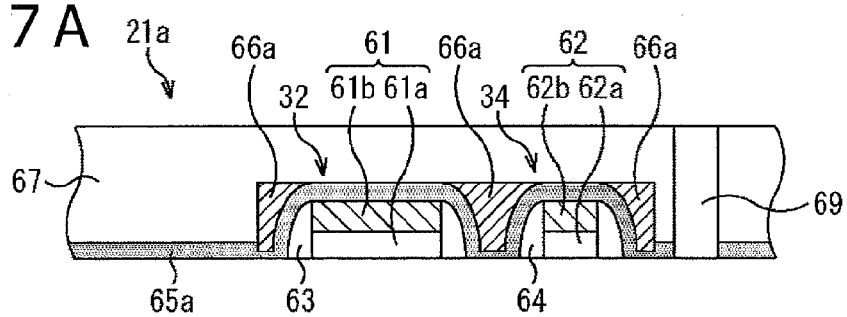
FIGS. 7A to 7D are cross-sectional views illustrating first to fourth modification examples of the first configuration example of the pixel.

FIG. 7A illustrates a pixel 21*a*, i.e., a first modification example. The pixel 21*a* differs in structure from the pixel 21 in that the tip portion of a light-shielding metal 66*a* is formed in such a manner as to protrude into the thickness of a liner film 65*a* toward the semiconductor substrate 41. That is, in the pixel 21*a*, the liner film 65*a* is also dug to a given depth along the outer peripheries of the gate electrodes 61 and 62 in the step adapted to perform the damascene process (fourth step in FIG. 5). Then, a metal is filled into the dug area of the liner film 65*a*, thus forming the light-shielding metal 66*a*.

The pixel 21*a* configured as described above suppresses leakage of diagonal light into the memory section 33 better than the pixel 21, thus providing improved smear characteristic. It should be noted that FIG. 7A illustrates that the liner film 65*a* is dug halfway. However, the liner film 65*a* may be, for example, fully dug to the gate oxide film (not shown) formed between the semiconductor substrate 41 and interconnect layer 42.

Figure 7B:
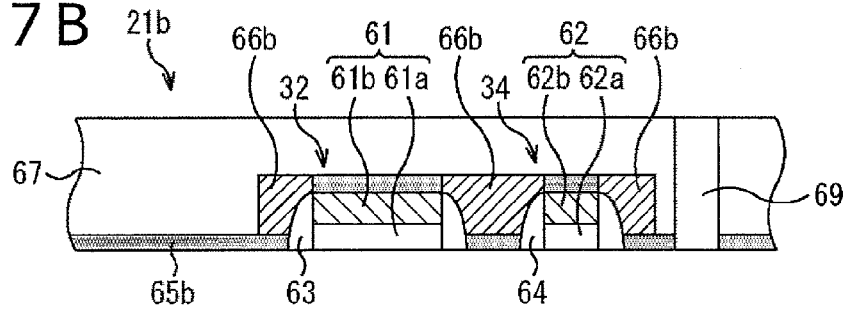

FIG. 7B illustrates a pixel 21*b*, i.e., a second modification example. The pixel 21*b* differs in structure from the pixel 21 in that a liner film 65*b* is formed in such a manner as not to cover the side walls 63 and 64, and that a light-shielding metal 66*b* is formed in such a manner as to be stacked directly on the side walls 63 and 64.

The pixel 21*b* configured as described above also provides further improved light-shielding capability. It should be noted that, in FIG. 7B, the liner film 65*b* is formed in such a manner as not to cover the side walls 63 and 64 at all. However, the liner film 65*b* may cover the side walls 63 and 64 halfway.

Figure 7C:
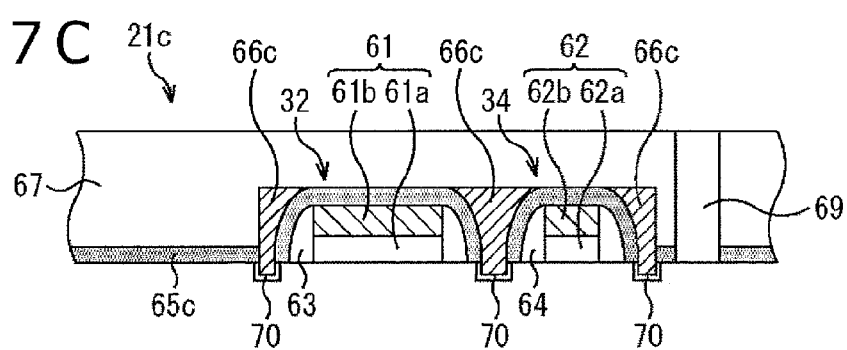

FIG. 7C illustrates a pixel 21*c*, i.e., a third modification example. The pixel 21*c* differs in structure from the pixel 21 in that the tip portion of a light-shielding metal 66*c* is formed in such a manner as to protrude to the semiconductor substrate 41. That is, in the pixel 21*c*, the semiconductor substrate 41 is, for example, dug down 100 nm in the step adapted to perform the damascene process (fourth step in FIG. 5). Then, a metal is also filled into the dug area of the semiconductor substrate 41, thus forming the light-shielding metal 66*c*.

Further, in such a structure, an insulating film 70 is formed in the dug area of the semiconductor substrate 41 to maintain insulation between the light-shielding metal 66*c* and semiconductor substrate 41. Among methods that can be used to form the insulating film 70 are oxidation using an oxidation furnace, film formation (oxide or nitride film) by RTO (Rapid Thermal Oxidation) or CVD, and ALD (Atomic Layer Deposition). On the other hand, boron may be implanted into the areas surrounding the dug area of the semiconductor substrate 41 to minimize damage to the same substrate 41. It should be noted that this step may be performed either before or after the insulation is achieved.

Figure 7D:
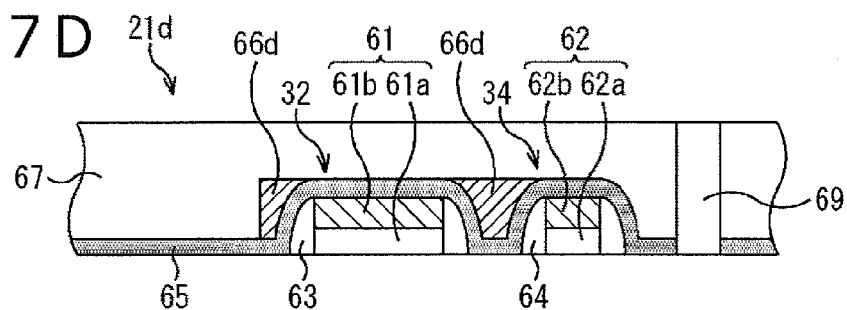

FIG. 7D illustrates a pixel 21d, i.e., a fourth modification example. The pixel 21d differs in structure from the pixel 21 in that a light-shielding metal 66d is formed in such a manner as to be arranged around the gate electrode 61 which is close to the memory section 33 and in such a manner as not to be arranged on the side of the gate electrode 62 which is far from the memory section 33. That is, the patterning by lithography during the formation of the light-shielding metal 66d can form the same metal 66d only around the gate electrode 61 which is the minimum necessity to shield light from the memory section 33.

It should be noted that the gate electrode 61 making up the transfer transistor 32 may have a laminated structure made up of the polysilicon layer 61a and metal layer 61b, and that polysilicon electrodes may be used for other transistors.

As described above, forming the light-shielding metal 66d at least around the gate electrode 61 provides the memory section 33 with light-shielding capability.

Figure 8:
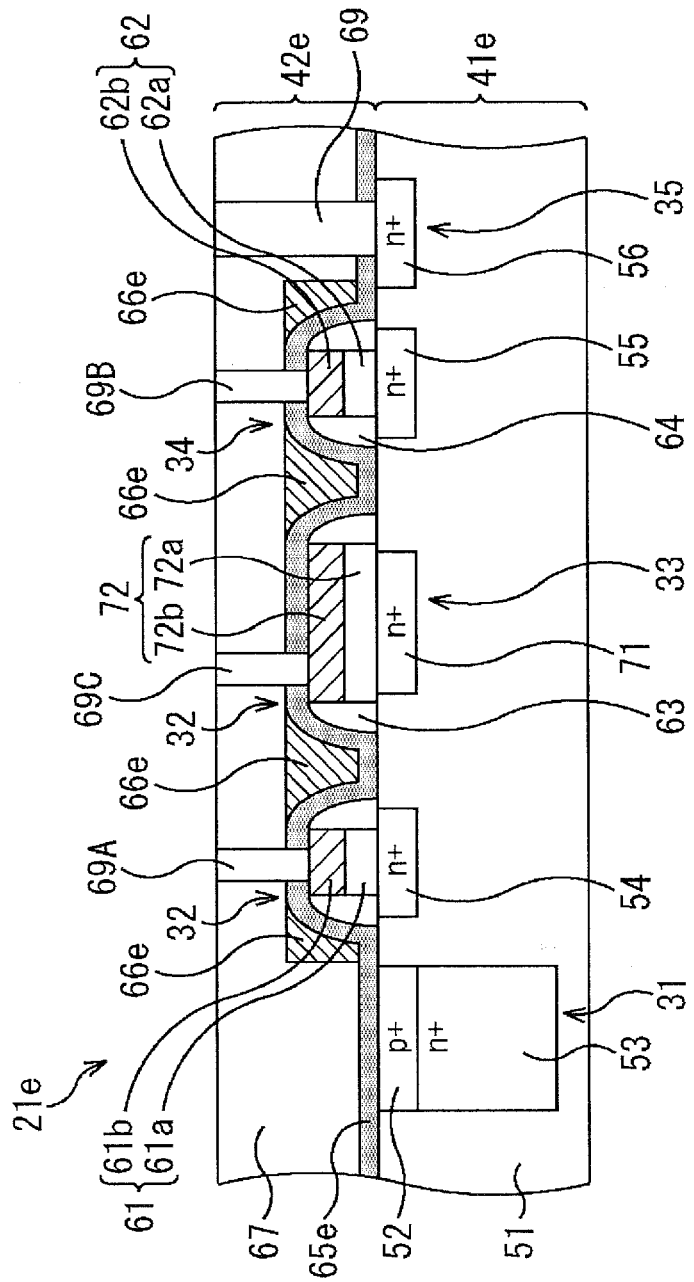
FIG. 8 is a cross-sectional view illustrating a fifth modification example of the first configuration example of the pixel.

Next, FIG. 8 illustrates a pixel 21e, i.e., a fifth modification example.

The pixel 21e differs in structure from the pixel 21 in that the memory section 33 is formed separately from the transfer transistor 32. That is, in the pixel 21e, an n-type region 71 making up the memory section 33 is formed in a semiconductor substrate 41e between the n-type region 54 and n-type region 55, and a gate electrode 72 making up the memory section 33 is formed between the gate electrode 61 of the transfer transistor 32 and the gate electrode 62 of the read transistor 34. The gate electrode 72 has a laminated structure in which a metal layer 72b is stacked on top of a polysilicon layer 72a, with a contact section 69c connected to the metal layer 72b. Further, in the pixel 21e, a light-shielding metal 66e is formed in such a manner as to surround the gate electrodes 61, 62 and 72.

Figure 9:
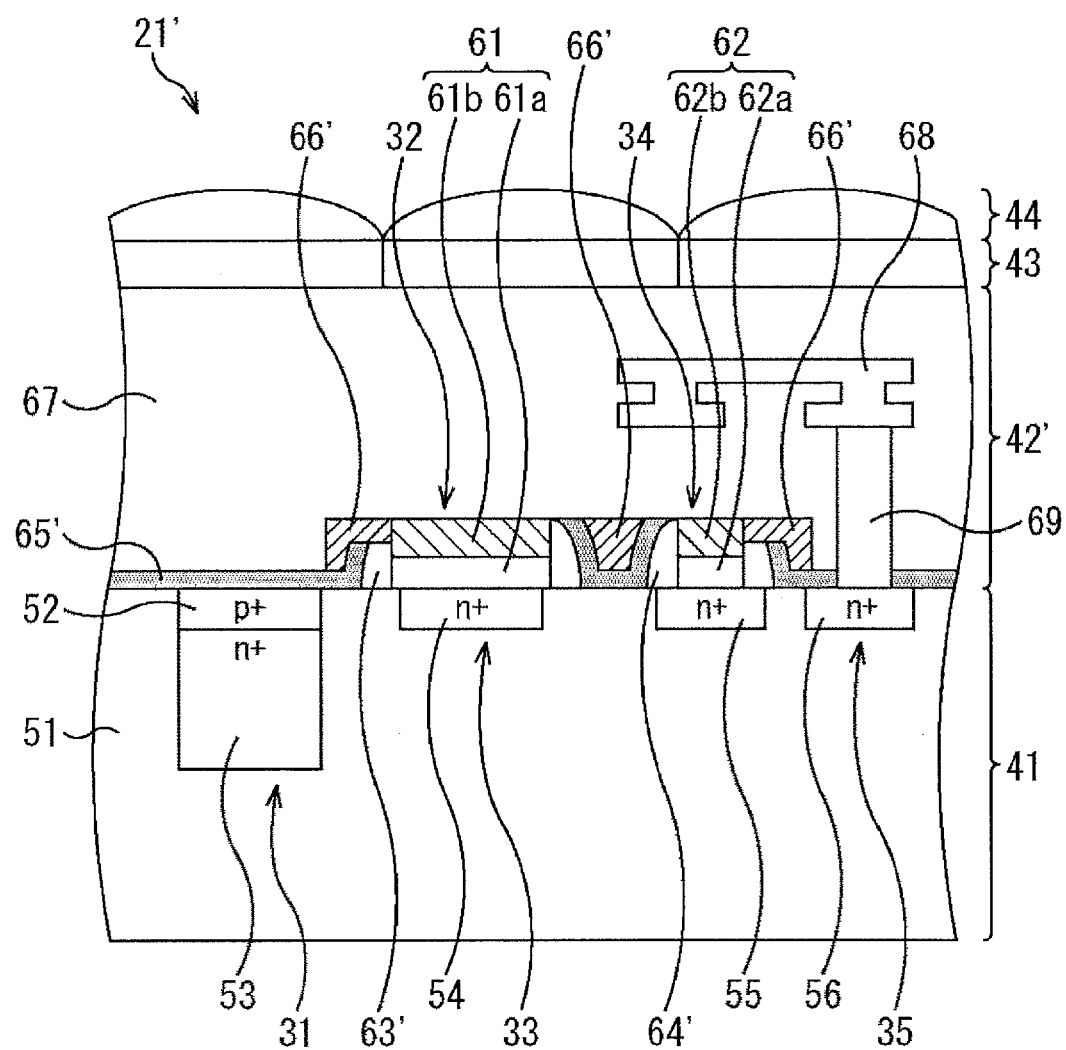
FIG. 9 is a cross-sectional view illustrating a second configuration example of the pixel of the imaging element.

Next, FIG. 9 is a cross-sectional view illustrating a second configuration example of the pixel of the imaging element 11. It should be noted that, in FIG. 9, components similar to those of the pixel 21 shown in FIG. 2 are denoted by the same reference numerals, and that a detailed description thereof is omitted.

In a pixel 21', a liner film 65' is formed in such a manner as not to cover the gate electrodes 61 and 62 in an interconnect layer 42'. Further, the pixel 21' differs in structure from the pixel 21 in that a light-shielding metal 66' is formed in such a manner that the liner film 65' is removed together with part of side walls 63' and 64', and that the light-shielding metal 66' is connected to the metal layers 61b and 62b.

More specifically, the liner film 65' is removed together with part of the side wall 63' on the side of the gate electrode 61 facing the PD 31 in the pixel 21', thus connecting the light-shielding metal 66' to the metal layer 61b on the side of the gate electrode 61 facing the PD 31. Further, the liner film 65' is removed together with part of the side wall 64' on the side of the gate electrode 62 facing the FD 35 in the pixel 21', the light-shielding metal 66' is connected to the metal layer 62b on the side of the gate electrode 62 facing the FD 35.

In the pixel 21' configured as described above, the height of the interconnect layer 42' can be further reduced by not covering the gate electrode 61 or 62 with the liner film 65'. Further, leakage of light into the memory section 33 can be further suppressed by connecting the light-shielding metal 66' to the metal layers 61b and 62b.

Figure 10:
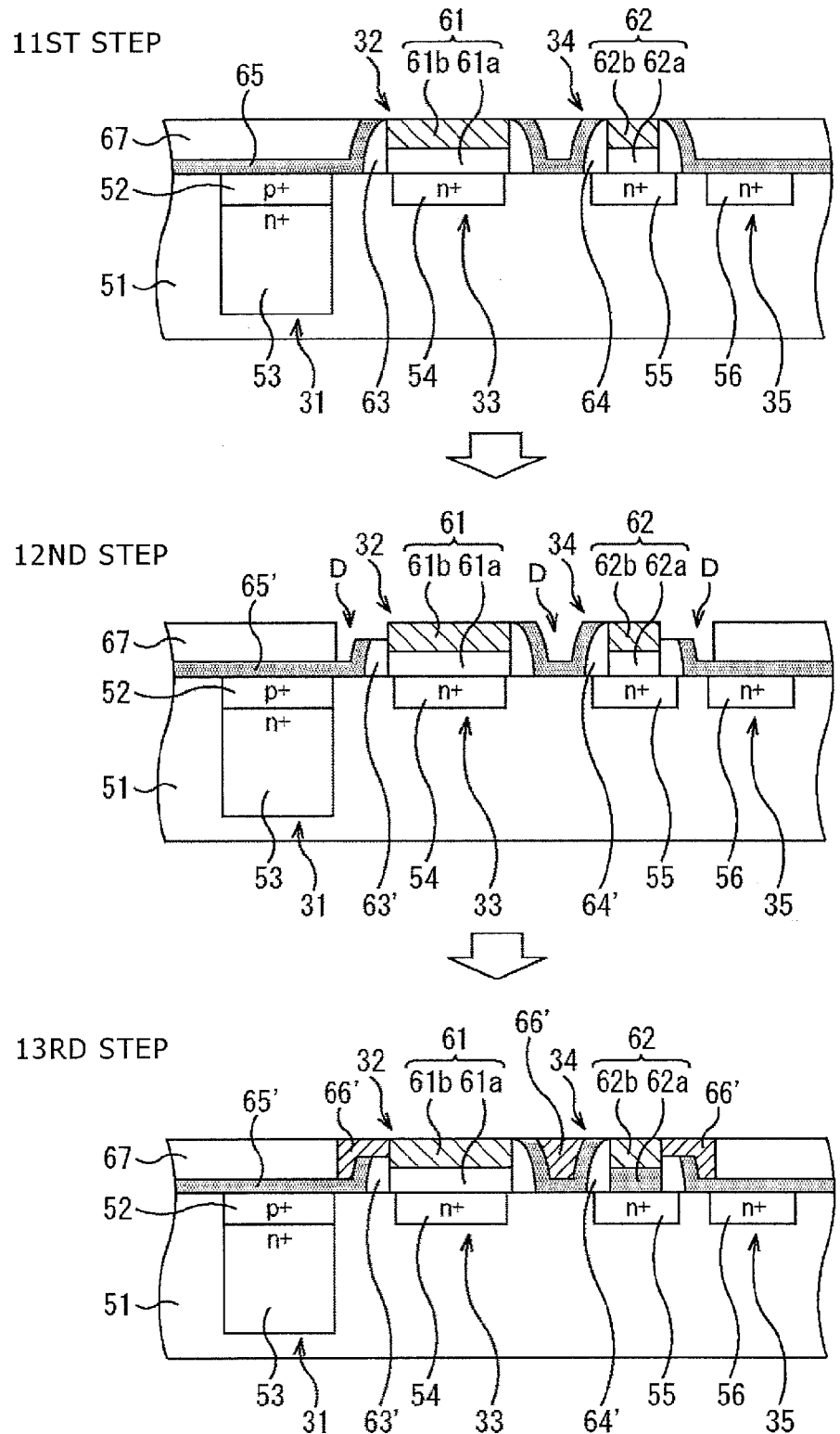
FIG. 10 is a set of explanatory diagrams describing the manufacturing method of the imaging element.

A description will be given next of the manufacturing method of the imaging element 11 having the pixel 21' with reference to FIG. 10.

First, the gate electrodes 61 and 62 and side walls 63 and 64 are formed, and then the liner film 65 is formed, followed by the formation of the interlayer insulating film 67 in the first to third steps in the same manner as described with reference to FIG. 4, thus forming a planarized structure.

Then, in the eleventh step, the interlayer insulating film 67 is dug, for example, by CMP until the metal layers 61b and 62b are exposed, thus removing the liner film 65.

In the twelfth step, a damascene portion is formed. That is, the peripheral areas of the transfer transistor 32, memory section 33 and read transistor 34 are patterned by lithography. It should be noted that the side of the gate electrode 61 facing the PD 31 and the side of the gate electrode 62 facing the FD 35 are also patterned unlike the fourth step shown in FIG. 5. At this time, the width of the areas subjected to the damascene process is, for example, 100 nm from the outer peripheries of the transfer transistor 32 and read transistor 34. It should be noted that this width can be adjusted as appropriate according to the pixel design and desired smear characteristic. Then, the groove portions D are formed by dry etching.

At this time, etching can be performed in two steps under different etching conditions. In the first step, the interlayer insulating film 67, liner film 65 and side walls 63 and 64 are etched with a low selection ratio. In the second step, only the interlayer insulating film 67 is etched by adjusting the selection ratio.

In the thirteenth step, the light-shielding metal 66' is formed.

That is, the light-shielding metal 66' is formed by filling a metal into the groove portions D formed by the damascene process in the fourth step. At this time, the side wall 63' has been etched so that the side of the gate electrode 61 facing the PD 31 is open. Therefore, the light-shielding metal 66'is formed in such a manner as to be connected to the metal layer 61b on the side of the gate electrode 61 facing the PD 31. Further, the side wall 64' has been etched so that the side of the gate electrode 62 facing the FD 35 is open. Therefore, the light-shielding metal 66' is formed in such a manner as to be connected to the metal layer 62b on the side of the gate electrode 62 facing the FD 35.

Then, as illustrated in FIG. 9, the contact section 69 is formed by additionally stacking the interlayer insulating film 67, followed by the formation of the interconnect 68 and the additional stacking of the interlayer insulating film 67 again. Then, the color filter layer 43 and on-chip lens layer 44 are formed, thus completing the formation of the imaging element 11 having global shutter capability.

In the imaging element 11 manufactured through the above steps, the height of the interconnect layer 42' of the pixel 21' can be further reduced by removing the liner film 65' in such a manner that the gate electrodes 61 and 62 are exposed. Further, leakage of light into the memory section 33 can be further suppressed by forming the groove portions D in such a manner that the metal layers 61b and 62b are connected to the light-shielding metal 66.

A description will be given next of modification examples of the second configuration example of the pixel 21' with reference to FIGS. 11 and 12.

Figures 11A, 11B:
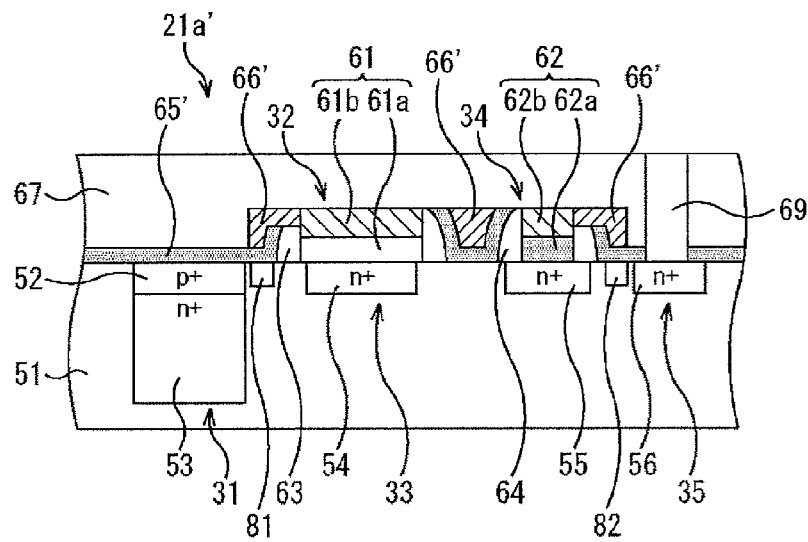
FIG. 11A is a cross-sectional view illustrating a first modification example of the second configuration example of the pixel.
FIG. 11B shows conceptual diagrams of potential.

FIG. 11A illustrates a pixel 21a', i.e., a first modification example. In the pixel 21a', an additional ion implantation section 81 is formed by adjusting the potential of the surface area of the silicon layer 51 for the light-shielding metal 66' formed on the side of the gate electrode 61 facing the PD 31. Similarly, in the pixel 21a', an additional ion implantation section 82 is formed by adjusting the potential of the surface area of the silicon layer 51 for the light-shielding metal 66' formed on the side of the gate electrode 62 facing the FD 35.

That is, the additional ion implantation section 81 is formed in the charge transfer path from the PD 31 to the memory section 33, and the additional ion implantation section 82 is formed in the charge transfer path from the memory section 33 to the FD 35. That is, the additional ion implantation sections 81 and 82 are formed because the light-shielding metal 66' may affect the potential of the semiconductor substrate 41 when a voltage is applied to the gate electrode 61 or 62.

A description will be given with reference to the conceptual diagrams of potential shown in FIG. 11B. For example, if there is no connection between the gate electrode 61 and light-shielding metal 66', with no additional ion implantation section formed (i.e., structure of the pixel 21 shown in FIG. 2), the potential condition is such that charge is transferred from the PD 31 to the memory section 33 when such charge transfer is turned ON.

However, for example, if there is connection between the gate electrode 61 and light-shielding metal 66', with the additional ion implantation sections 81 and 82 not formed, when charge transfer from the PD 31 to the memory section 33 is turned ON, the potential of the transfer path between the PD 31 and memory section 33 becomes deeper, possibly resulting in transfer charge failure. Therefore, even if there is connection between the gate electrode 61 and light-shielding metal 66', it is preferred that the potential condition should be the same as when there is no connection therebetween.

For this reason, the additional ion implantation sections 81 and 82 are formed. This provides a potential condition that permits charge transfer from the PD 31 to the memory section 33 when such charge transfer is turned ON even if there is connection between the gate electrode 61 and light-shielding metal 66'.

The additional ion implantation sections 81 and 82 are formed, for example, by reducing the dosage of n+ ion implantation or performing counter-implantation of p+ ions only immediately under the light-shielding metal 66. This makes it possible to avoid charge transfer failure, thus positively transferring charge. Further, similar transfer failure is likely not only in the transfer transistor 32 but also in the memory section 33, read transistor 34 and FD 35. Forming additional ion implantation sections ensures charge transfer.

It should be noted that the metal layers 61b and 62b may be expanded in the region between the gate electrodes 61 and 62 to such an extent that there is no shorting between the metal layers 61b and 62b. Such a structure also suppresses leakage of light, thus providing improved smear characteristic.

Figure 12A:
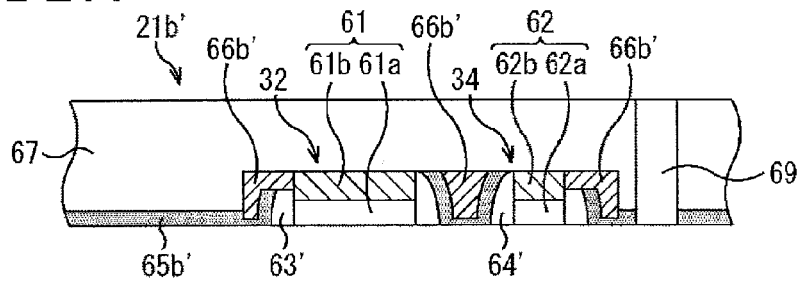
FIGS. 12A to 12D are cross-sectional views illustrating second to fifth modification examples of the second configuration example of the pixel.

FIG. 12A illustrates a pixel 21b', i.e., a second modification example. The pixel 21b' differs in structure from the pixel 21' in that the tip portion of a light-shielding metal 66b' is formed in such a manner as to protrude into the thickness of a liner film 65b' toward the semiconductor substrate 41. That is, in the pixel 21b', the liner film 65b' is also dug to a given depth along the outer peripheries of the gate electrodes 61 and 62 in the step adapted to perform the damascene process (twelfth step in FIG. 10). Then, a metal is filled into the dug area of the liner film 65b', thus forming the light-shielding metal 66b'.

The pixel 21b' configured as described above suppresses leakage of diagonal light into the memory section 33 better than the pixel 21', thus providing improved smear characteristic. It should be noted that FIG. 12A illustrates that the liner film 65b' is dug halfway. However, the liner film 65b' may be, for example, fully dug to the gate oxide film (not shown) formed between the semiconductor substrate 41 and interconnect layer 42.

Figure 12B:
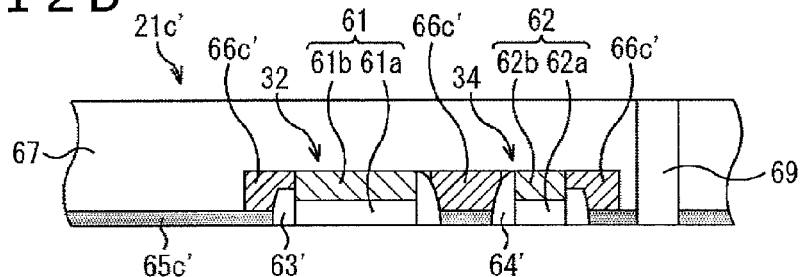

FIG. 12B illustrates a pixel 21c', i.e., a third modification example. The pixel 21c' differs in structure from the pixel 21' in that a liner film 65c' is formed in such a manner as not to cover the side walls 63' and 64', and that a light-shielding metal 66c' is formed in such a manner as to be stacked directly on the side walls 63' and 64'.

The pixel 21c' configured as described above also provides further improved light-shielding capability. It should be noted that, in FIG. 12B, the liner film 65c' is formed in such a manner as not to cover the side walls 63' and 64' at all. However, the liner film 65c' may cover the side walls 63' and 64' only halfway.

Figure 12C:
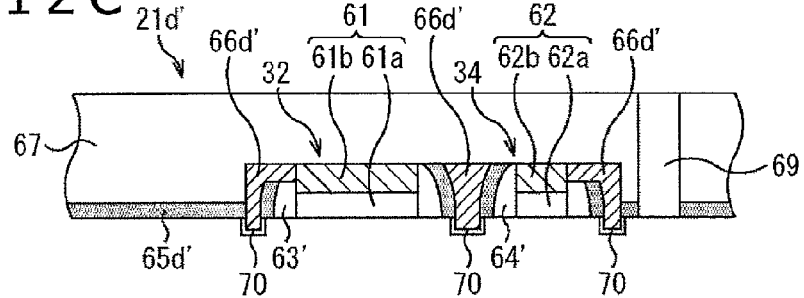

FIG. 12C illustrates a pixel 21d', i.e., a fourth modification example. The pixel 21d' differs in structure from the pixel 21' in that the tip portion of a light-shielding metal 66d' is formed in such a manner as to protrude to the semiconductor substrate 41. That is, in the pixel 21d', the semiconductor substrate 41 is, for example, dug down 100 nm in the step adapted to perform the damascene process (twelfth step in FIG. 10). Then, a metal is also filled into the dug area of the semiconductor substrate 41, thus forming the light-shielding metal 66d'.

Further, in such a structure, the insulating film 70 is formed in the dug area of the semiconductor substrate 41 to maintain insulation between the light-shielding metal 66d' and semiconductor substrate 41. Among methods that can be used to form the insulating film 70 are oxidation using an oxidation furnace, film formation (oxide or nitride film) by RTO (Rapid Thermal Oxidation) or CVD, and ALD (Atomic Layer Deposition). On the other hand, boron may be implanted into the areas surrounding the dug area of the semiconductor substrate 41 to minimize damage to the same substrate 41. It should be noted that this step may be performed either before or after the insulation is achieved.

Figure 12D:
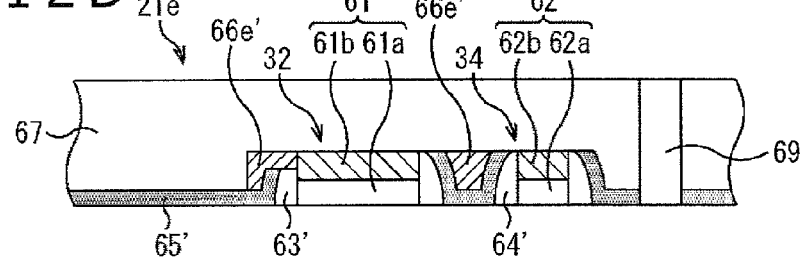

FIG. 12D illustrates a pixel 21e', i.e., a fifth modification example. The pixel 21e' differs in structure from the pixel 21' in that a light-shielding metal 66e' is formed in such a manner as to be arranged around the gate electrode 61 which is close to the memory section 33 and in such a manner as not to be arranged on the side of the gate electrode 62 which is far from the memory section 33. That is, the patterning by lithography during the formation of the light-shielding metal 66e' can form the same metal 66e' only around the gate electrode 61 which is the minimum necessity to shield light from the memory section 33.

It should be noted that the gate electrode 61 making up the transfer transistor 32 may have a laminated structure made up of the polysilicon layer 61a and metal layer 61b, and that polysilicon electrodes may be used for other transistors.

As described above, forming the light-shielding metal 66e' at least around the gate electrode 61 provides the memory section 33 with light-shielding capability.

Incidentally, the damascene structure of the light-shielding metal 66 may be applied to the peripheral circuitry.

A description will be given below of the application of a damascene structure to the peripheral circuitry with reference to FIGS. 13A and 13B.

Figure 13A:
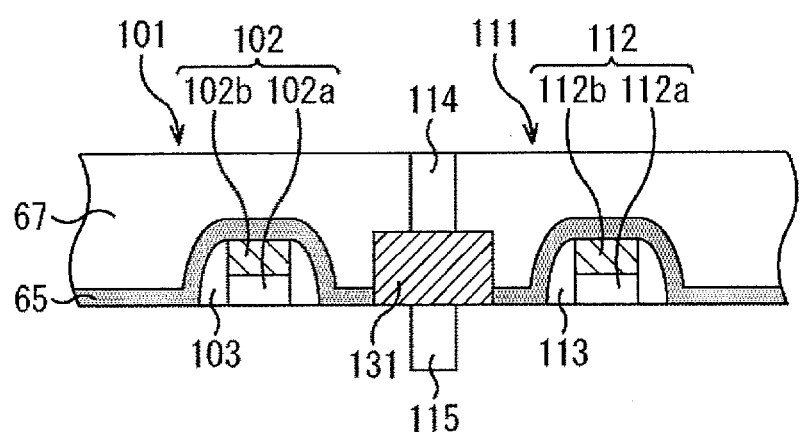
FIGS. 13A and 13B are explanatory diagrams describing the application of a damascene structure to a peripheral circuit section.

FIG. 13A illustrates a peripheral circuit to which a damascene structure similar to that of the pixel 21 shown in FIG. 2 is applied. A light-shielding metal 131 having the damascene structure is formed between transistors 101 and 111. A gate electrode 102 making up the transistor 101 has a laminated structure in which a metal layer 102b is stacked on top of a polysilicon layer 102a, with a side wall 103 formed around the gate electrode 102. Similarly, a gate electrode 112 making up the transistor 111 has a laminated structure in which a metal layer 112b is stacked on top of a polysilicon layer 112a, with a side wall 113 formed around the gate electrode 112.

Further, the light-shielding metal 131 connects a contact section 114 and STI (Shallow Trench Isolation) section 115. The same metal 131 can serve as a local interconnect by connecting the active regions.

Such a structure provides higher integration of peripheral circuitry, thus contributing to higher circuit efficiency and higher freedom in circuit design.

Figure 13B:
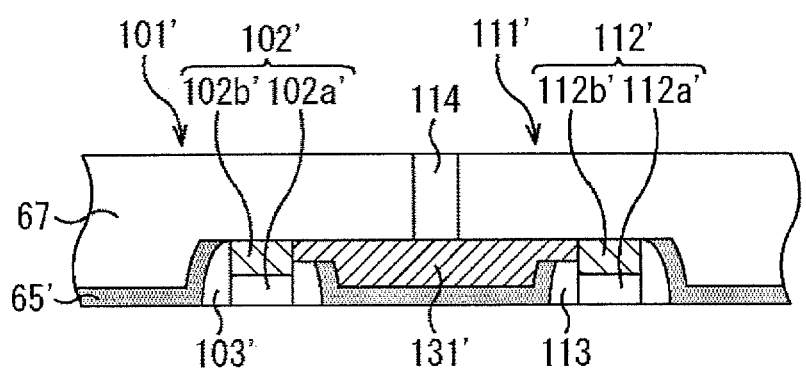

FIG. 13B illustrates a peripheral circuit to which a damascene structure similar to that of the pixel 21' shown in FIG. 9 is applied. A light-shielding metal 131' having the damascene structure is formed between transistors 101' and 111'. A gate electrode 102' making up the transistor 101' has a laminated structure in which a metal layer 102b' is stacked on top of a polysilicon layer 102a', with a side wall 103' formed around the gate electrode 102'. Similarly, a gate electrode 112' making up the transistor 111' has a laminated structure in which a metal layer 112b' is stacked on top of a polysilicon layer 112a', with a side wall 113' formed around the gate electrode 112'.

Further, the light-shielding metal 131' connects the polysilicon layer 102a', metal layer 102b' and contact section 114. The same metal 131' can serve as a local interconnect by connecting the gates.

Such a structure provides higher integration of peripheral circuitry, thus contributing to higher circuit efficiency and higher freedom in circuit design.

Figure 14:
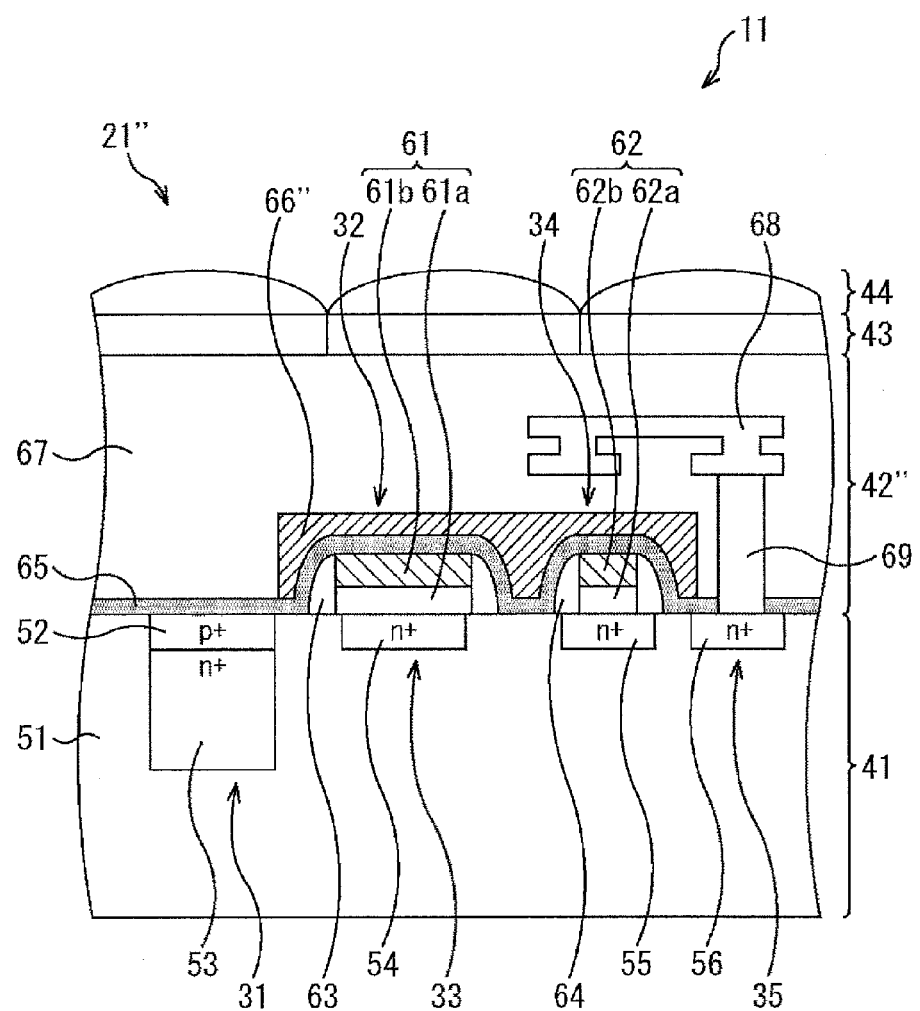
FIG. 14 is a cross-sectional view illustrating a third configuration example of the pixel of the imaging element.

Next, FIG. 14 is a cross-sectional view illustrating a third configuration example of the pixel of the imaging element 11. It should be noted that, in FIG. 14, components similar to those of the pixel 21 shown in FIG. 2 are denoted by the same reference numerals, and that a detailed description thereof is omitted.

A pixel 21" differs in structure from the pixel 21 in that a light-shielding metal 66" is formed in an interconnect layer 42" in such a manner as to entirely cover the transfer transistor 32 and read transistor 34.

Figure 15:
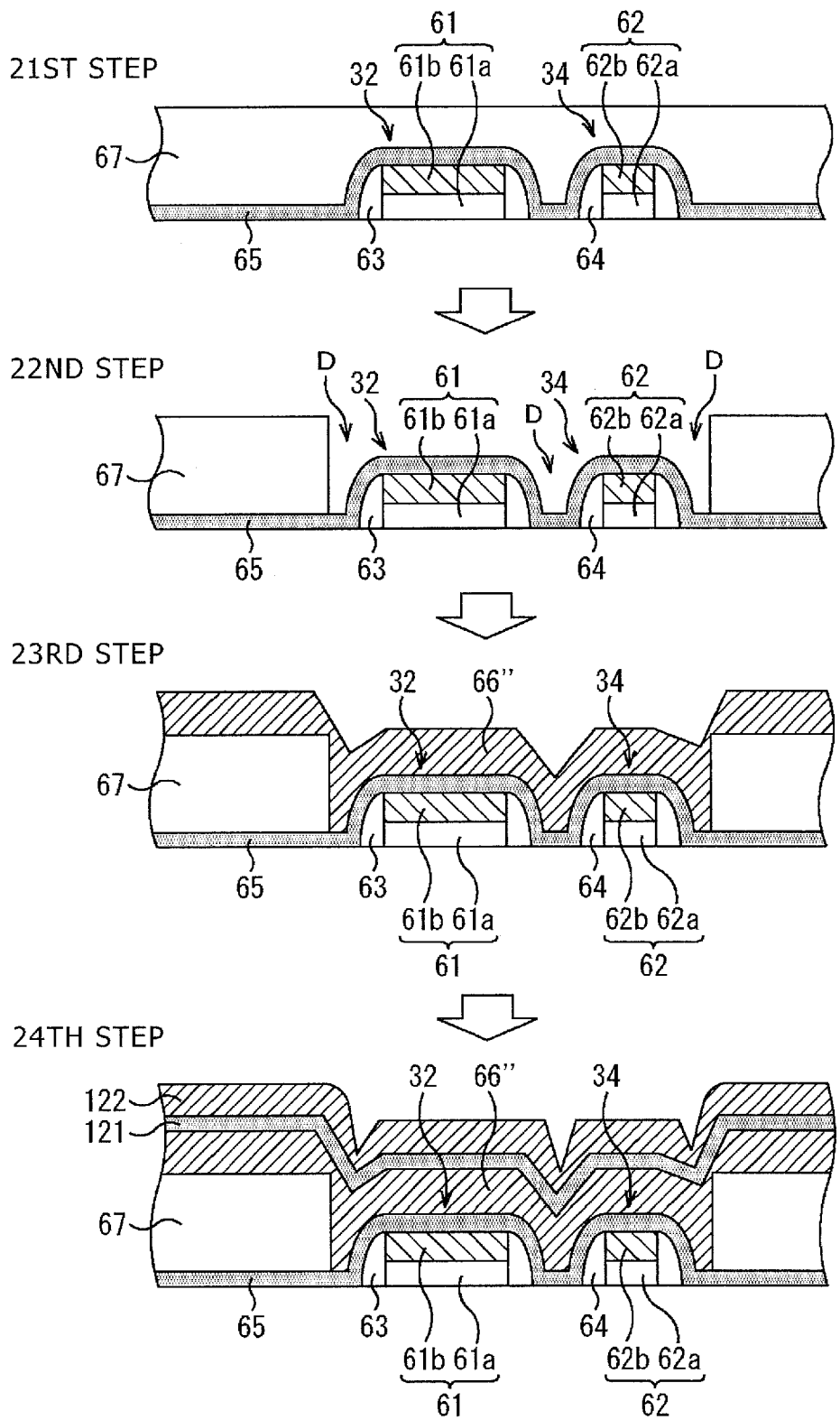
FIG. 15 is a set of explanatory diagrams describing the manufacturing method of the imaging element.

A description will be given next of the manufacturing method of the imaging element 11 having the pixel 21" with reference to FIGS. 15 and 16.

First, a structure having the gate electrodes 61 and 62 and side walls 63 and 64 is formed in the first and second steps in the same manner as described with reference to FIG. 4.

Then, in the twenty first step, the liner film 65 is formed over the entire surface, followed by the formation of the interlayer insulating film 67. Here, the interlayer insulating film 67 is formed where the transfer transistor 32 and read transistor 34 are to be covered. Therefore, the same film 67 is formed 150 nm thick on the liner film 65.

In the twenty second step, a damascene portion is formed in the same manner as in the fourth step illustrated in FIG. 5.

In the twenty third step, the light-shielding metal 66" is formed. That is, the light-shielding metal 66" is formed, for example, by forming a blanket film using sputtered tungsten in the groove portions D formed by the damascene process in the twenty second step. It should be noted that, unlike in the fifth step shown in FIG. 5, CMP or dry etching is not performed in the twenty third step. As illustrated in FIG. 15, therefore, the surface of the light-shielding metal 66" is formed in a concave shape where there are the groove portions D so as to follow the shape of the surface formed in the twenty second step.

In the twenty fourth step, a stopper layer 121 is formed, followed by the formation of a metal layer 122. It should be noted that the stopper layer 121 and metal layer 122 are formed in concave and convex shapes so as to follow the surface shape of the light-shielding metal 66". Materials that can be used as the stopper layer 121 are those which provide a selection ratio during CMP such as oxide, nitride and other insulating films and barrier metals such as Ti and Ta and nitrides thereof. Thus, it is possible to avoid dishing during CMP by forming the stopper layer 121 between the light-shielding metal 66" and metal layer 122.

It should be noted that dishing may be avoided not only by providing the stopper layer 121 but also by using etchback rather than CMP. In this case, after the light-shielding metal 66" is formed, the same metal 66" is planarized by applying a resist, thus reducing the selection ratio between the resist and light-shielding metal 66" to the extent possible and removing the same metal 66" in the undesired areas.

Next, CMP is performed for the first time in the twenty fifth step as illustrated in FIG. 16.

In the twenty sixth step, the light-shielding metal 66" is covered with a resist 123, thus peeling off the stopper layer 121.

In the twenty seventh step, CMP is performed for the second time, thus completing the formation of the light-shielding metal 66". At this time, the stopper layer 121 is formed in the concave portions of the light-shielding metal 66", thus preventing dishing during CMP. It should be noted that part of the stopper layer 121 is left unremoved in FIG. 16 as a result of following the concave and convex shapes of the light-shielding metal 66". However, the stopper layer 121 may be completely removed by CMP.

In the twenty eighth step, the interlayer insulating film 67 is additionally stacked, thus forming the contact section 69. It should be noted that FIG. 16 illustrates a cross-sectional configuration of the area where the contact section 69A to be connected to the gate electrode 61 and the contact section 69B to be connected to the gate electrode 62 are formed. It should be noted that a spacing of about 200 nm is provided between the contact section 69A and light-shielding metal 66" and between the contact section 69B and light-shielding metal 66" to avoid shorting with the same metal 66" during the formation of the contact sections 69A and 69B.

Then, as illustrated in FIG. 14, the interconnect 68 is formed, followed by the additional stacking of the interlayer insulating film 67. Then, the color filter layer 43 and on-chip lens layer 44 are formed, thus completing the formation of the imaging element 11 having global shutter. capability.

It should be noted that, in the pixel 21", the light-shielding metal 66" is formed in such a manner as to entirely cover the transfer transistor 32 and read transistor 34. Therefore, the gate electrodes 61 and 62 may be devoid of the metal layers 61b and 62b.

Figure 17:
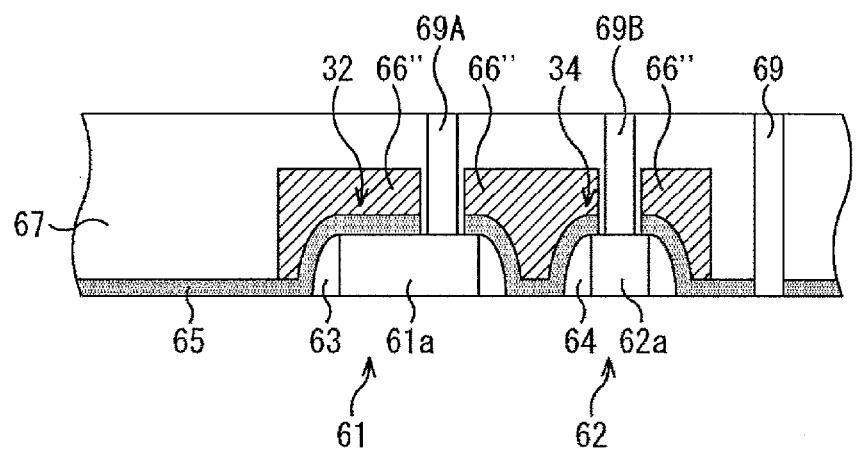
FIG. 17 is a cross-sectional view of the area where the contact section to be connected to the gate electrode is formed.

That is, as illustrated in FIG. 17, the gate electrode 61 includes the polysilicon layer 61a, and the gate electrode 62 the polysilicon layer 62a. It should be noted that the layout of the contacts in this configuration should preferably be engineered in such a manner as to avoid the deterioration of light-shielding capability so as to minimize the impact.

It should be noted that the height of the interconnect layer 42" can be reduced by forming the light-shielding metal 66" in such a manner as to entirely cover the transfer transistor 32 and read transistor 34 as done in the pixel 21".

Figure 18:
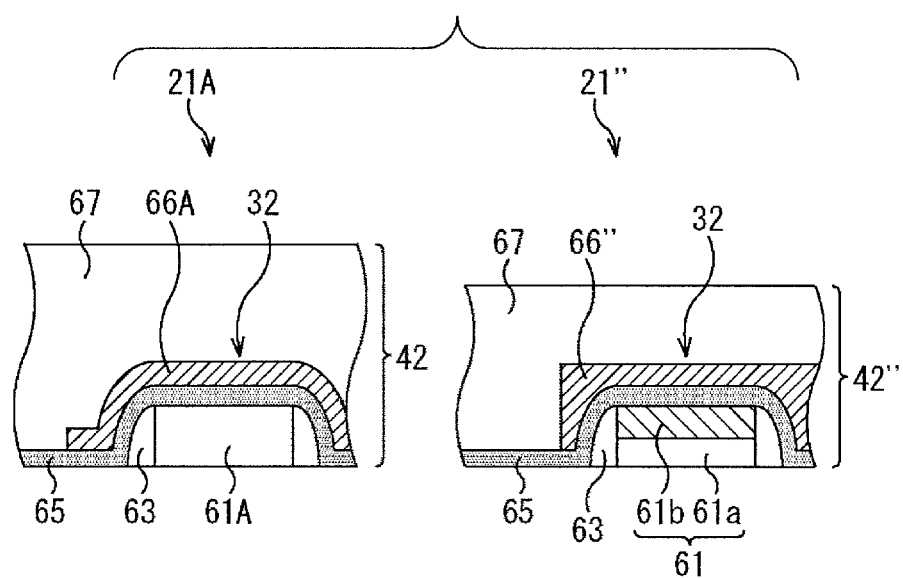
FIG. 18 is a set of explanatory diagrams describing the comparison with the structure in related art.

FIG. 18 illustrates a cross-sectional view of the area near the transfer transistor 32 of the pixel 21A in related art (FIG. 3) and a cross-sectional view of the area near the transfer transistor 32 of the pixel 21".

It is generally known that the size of the concave and convex structure of the underlying layer affects the film left unremoved in the CMP process adapted to planarize the PMD (Pre-Metal Dielectric). The smaller the difference in level, the thinner the film left unremoved can be. That is, in the pixel 21A, there are two differences in level, one resulting from the thickness of the gate electrode 61, and another of the light-shielding metal 66A. In contrast, in the pixel 21", there is only one difference in level, namely, that of the gate electrode 61. As a result, the structure of the pixel 21" can reduce the thickness of the interconnect layer 42" by 20% as compared to that of the pixel 21A, thus providing improved sensitivity.

Further, the imaging element 11 described above is applicable, for example, to imaging systems such as digital still camera and digital video camcorder, mobile phones having imaging capability, and a variety of electronic equipment including those having imaging capability.

Figure 19:
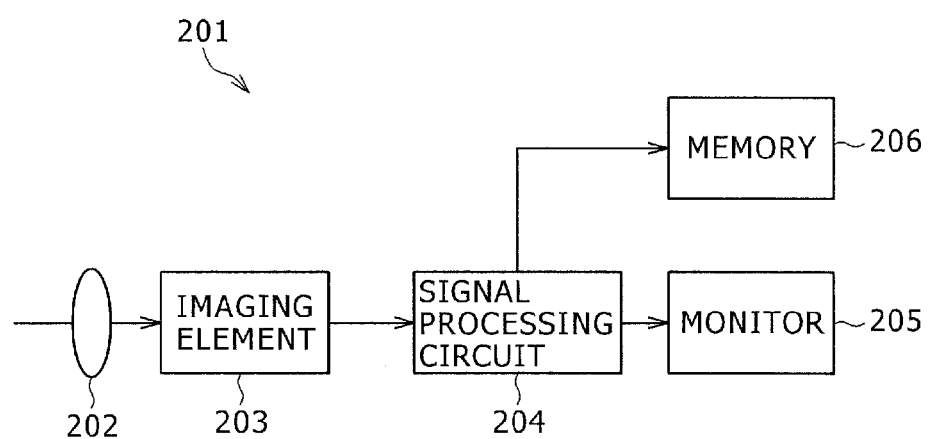
FIG. 19 is a block diagram illustrating a configuration example of the imaging device incorporated in electronic equipment.

FIG. 19 is a block diagram illustrating a configuration example of the imaging device incorporated in electronic equipment.

As illustrated in FIG. 19, an imaging device 201 includes an optics 202, an imaging element 203, a signal processing circuit 204, a monitor 205 and a memory 206 to capture still and moving images.

The optics 202 includes one or a plurality of lenses to guide image light from the subject (incident light) to the imaging element 203 and form an image on the light reception surface (sensor section) of the imaging element 203.

The imaging element 11 having the pixel 21 shown in one of the configuration examples or modification examples is used as the imaging element 203. The imaging element 203 accumulates electrons for a given period of time according to the image formed on the light reception surface of the optics 202. Then, a signal whose level is proportional to the amount of electrons accumulated in the imaging element 203 is supplied to the signal processing circuit 204.

The signal processing circuit 204 subjects the signal charge output from the imaging element 203 to a variety of signal processing operations. The image (image data) obtained from the signal processing performed by the signal processing circuit 204 is supplied to and displayed on the monitor 205 or supplied to and stored (recorded) in the memory 206.

The imaging device 201 configured as described above uses the imaging element 11 having the pixel 21 shown in one of the configuration examples or modification examples as the imaging element 203, thus providing excellent sensitivity and smear characteristics for excellent image quality.

It should be noted that the present technology may have the following configurations.

(1) A solid-state imaging element including:
a transfer section configured to transfer charge generated simultaneously by a photoelectric conversion section in all pixels to a memory section and have a metal gate; and
a light-shielding section formed by filling a metal into a groove portion formed by digging an interlayer insulating film around the transfer section.

(2) The solid-state imaging element of feature 1,in which
the tip portion of the light-shielding section is formed in such a manner as to protrude into the thickness of a liner film, formed between the interlayer insulating film and a semiconductor substrate, toward the semiconductor substrate around the transfer section.

(3) The solid-state imaging element of feature 1 or 2,in which
the metal gate of the transfer section and the light-shielding section are partially connected.

(4) The solid-state imaging element of any one of features 1 to 3, in which
a metal section serving as a local interconnect is formed during the formation of the light-shielding section in a peripheral circuit section formed around a pixel array section having the plurality of pixels arranged in an array form.

It should be noted that the present embodiment is not limited to that described above but may be modified in various ways without departing from the scope of the present disclosure.

The present technology contains subject matter related to that disclosed in Japanese Priority Patent Application JP 2011-254645 filed in the Japan Patent Office on Nov. 22, 2011, the entire content of which is hereby incorporated by reference.

What is claimed is:

1. A solid-state imaging element comprising:
a plurality of pixels, respective ones of the plurality of pixels including:
a photoelectric conversion section;
a transfer section configured to transfer charge generated by the photoelectric conversion section to a memory section and have a metal gate;
an interlayer insulating film having a groove portion around the transfer section;
a liner film disposed between the interlayer insulating film and the transfer section; and
a light-shielding section disposed in the groove portion and having a substantially planar upper surface which is flush with a surface of the liner film,
wherein respective transfer sections of the plurality of pixels are configured to simultaneously transfer charge generated by a respective photoelectric conversion section.

2. The solid-state imaging element of claim 1, wherein
a tip portion of the light-shielding section protrudes into the liner film in a thickness direction, the liner film disposed between the interlayer insulating film and a semiconductor substrate, the thickness direction being a direction toward the semiconductor substrate around the transfer section.

3. The solid-state imaging element of claim 1, wherein
respective metal gates of the respective transfer sections and respective light-shielding sections are partially connected.

4. The solid-state imaging element of claim 1, wherein
a metal section serving as a local interconnect is formed during the formation of the light-shielding section in a peripheral circuit section formed around a pixel array section having the plurality of pixels arranged in an array form.

5. The solid-state imaging element according to claim 1, wherein a height of the groove portion is the same as a distance from the metal gate of the transfer section to a semiconductor substrate.

6. The solid-state imaging element according to claim 1, wherein the groove portion extends about 100 nm from the outer periphery of the transfer section.

7. Electronic equipment comprising
a solid-state imaging element including a plurality of pixels, respective ones of the plurality of pixels including:
a photoelectric conversion section;
a transfer section configured to transfer charge generated by the photoelectric conversion section to a memory section and have a metal gate;
an interlayer insulating film having a groove portion around the transfer section;

a liner film disposed between the interlayer insulating film and the transfer section; and a light-shielding section disposed in the groove portion and having a substantially planar upper surface which is flush with a surface of the liner film, wherein respective transfer sections of the plurality of pixels are configured to simultaneously transfer charge generated by a respective photoelectric conversion section.

8. The electronic apparatus according to claim 7, wherein a tip portion of the light-shielding section protrudes into the liner film in a thickness direction, the liner film disposed between the interlayer insulating film and a semiconductor substrate, the thickness direction being a direction toward the semiconductor substrate around the transfer section.

9. The electronic apparatus according to claim 7, wherein respective metal gates of the respective transfer sections and respective light-shielding sections are partially connected.

10. The electronic apparatus according to claim 7, wherein a metal section serving as a local interconnect is formed during the formation of the light-shielding section in a peripheral circuit section formed around a pixel array section having the plurality of pixels arranged in an array form.

11. The electronic apparatus according to claim 7, wherein a height of the groove portion is the same as a distance from the metal gate of the transfer section to a semiconductor substrate.

12. The electronic apparatus according to claim 7, wherein the groove portion extends about 100 nm from the outer periphery of the transfer section.

13. A manufacturing method comprising:
    forming a plurality of pixels, respectively including,
        forming a photoelectric conversion section;
        forming a metal gate of a transfer section configured to transfer charge generated by the photoelectric conversion section to a memory section;
        forming a liner film on the transfer section;
        forming an interlayer insulating film having a groove portion around the transfer section; and
        forming a light-shielding section in the groove portion and having a substantially planar upper surface which is flush with a surface of the liner film,
    transferring charge generated by a respective photoelectric conversion section from respective transfer sections of the plurality of pixels simultaneously.

* * * * *